US006348884B1

(12) United States Patent
Steensgaard-Madsen

(10) Patent No.: US 6,348,884 B1
(45) Date of Patent: Feb. 19, 2002

(54) IDLE-TONE-FREE MISMATCH-SHAPING ENCODERS

(76) Inventor: Jesper Steensgaard-Madsen, Ellinge Mosevej 3, Hoejby Sjaelland 4573 (DK)

( * ) Notice: Subject to any disclaimer, the term of this patent is extended or adjusted under 35 U.S.C. 154(b) by 0 days.

(21) Appl. No.: 09/309,313

(22) Filed: May 11, 1999

Related U.S. Application Data
(60) Provisional application No. 60/115,282, filed on Jan. 6, 1999.

(51) Int. Cl.$^7$ ................................................. H03M 1/06
(52) U.S. Cl. ........................ 341/118; 341/141; 341/144; 341/155
(58) Field of Search ................................ 341/143, 150, 341/118, 141, 155

(56) References Cited

U.S. PATENT DOCUMENTS

| | | | |
|---|---|---|---|
| 5,138,317 A | | 8/1992 | Story |
| 5,221,926 A | | 6/1993 | Jackson |
| 5,404,142 A | | 4/1995 | Adams |
| 5,406,283 A | * | 4/1995 | Leung ........................ 341/143 |
| 5,684,482 A | | 11/1997 | Galton |
| 5,977,899 A | * | 11/1999 | Adams ........................ 341/145 |

OTHER PUBLICATIONS

Rex T. Bairo and Terri S. Fiez "Linearity Enhancement of Multibit ΔΣ A/D and D/A Converters using Data Weighed Averaging" IEEE Transactions on Circuits & Systems II vol. 42 No. 12 Dec. 1995, pp. 753–762.

Feng Chen & Bosco Leung "Some Observations on Tone Behavior in Data Weighted Averaging" IEEE Intern. Symp. on Circuits and Systems 1998—CDROM.

Henrik T. Jensen & Ian Galton A reduced–complexity Mismatch–shaping DAC for Delta–Sigma Data Converters IEEE International Symp. on Circuits and Systems 1998—CDROM.

Tao Shui, Richard Schreier, and Forrest Hudson "Mismatch–Shaping DAC for Low–pass and Bandpass Multibit Delta–Sigma Modulators" IEEE Intern. Symp. on Circuits and Systems 1998—CDROM.

Akira Yasuda, Hiroshi Tanimoto, and Tetsuya Iida "A Third–Order ΔΣ Modulator Using 2nd order Noise–Shaping Dyn. Element Matching" IEEE Journal of Solid–State Circuits, vol. 33, No. 12, 1998 pp. 1879–1886.

Richard Schreier & B. Zhang "Noise–Shaped MultiBit D/A Converter employing unit elements" IEE Electronics Letters Sep. 28, 1995 vol. 31 No. 20 pp. 1712–1713.

A. Keady and C. Lyden "Tree structure for Mismatch–Shaping Multibit DAC" IEE Electronics Letters Aug. 14, 1997 vol. 33 No. 17 pp. 1431–1432.

A. Yasuda and H. Tanimoto "Noise Shaping dynamic element matching method using tree structure" IEE Electronics Letters Jan. 16th 1997 vol. 33 No. 2 pp. 130–131.

R. Schreier "Mismatch–Shaping Digital–to–Analog Conversion" Presented at the 103rd Convention Sep. 26–29, 1997 New York Audio Engineering Society Preprint 4529 (E–1).

* cited by examiner

*Primary Examiner*—Peguy JeanPierre

(57) ABSTRACT

A technique to suppress idle tones in any mismatch-shaping encoder for use with a unit-element digital-to-analog converter. The arbitrary mismatch-shaping encoder provides a first set of signals which normally are intended to control directly the unit elements. A scrambler is used to interchange the first set of signals, thereby generating a second set of signals which are used to control the unit elements. The scrambler interchanges the signals as a function of a selector signal. A detecting circuit is used to evaluate in which clock cycles the unit elements have been used equally often. When this occurs, the selector signal is randomly assigned a new value in the following clock cycle.

15 Claims, 19 Drawing Sheets

Truth table for the binary-to-thermometer encoder [46]

| $d(k)$ | $b_8(k)$ | $b_7(k)$ | $b_6(k)$ | $b_5(k)$ | $b_4(k)$ | $b_3(k)$ | $b_2(k)$ | $b_1(k)$ |
|---|---|---|---|---|---|---|---|---|
| 0 | 0 | 0 | 0 | 0 | 0 | 0 | 0 | 0 |
| 1 | 0 | 0 | 0 | 0 | 0 | 0 | 0 | 1 |
| 2 | 0 | 0 | 0 | 0 | 0 | 0 | 1 | 1 |
| 3 | 0 | 0 | 0 | 0 | 0 | 1 | 1 | 1 |
| 4 | 0 | 0 | 0 | 0 | 1 | 1 | 1 | 1 |
| 5 | 0 | 0 | 0 | 1 | 1 | 1 | 1 | 1 |
| 6 | 0 | 0 | 1 | 1 | 1 | 1 | 1 | 1 |
| 7 | 0 | 1 | 1 | 1 | 1 | 1 | 1 | 1 |
| 8 | 1 | 1 | 1 | 1 | 1 | 1 | 1 | 1 |

Fig. 6 (Prior Art)

Truth table for the rotate-by-0/4 demultiplexer [48]

| $c_3(k)$ | $m_8(k)$ | $m_7(k)$ | $m_6(k)$ | $m_5(k)$ | $m_4(k)$ | $m_3(k)$ | $m_2(k)$ | $m_1(k)$ |
|---|---|---|---|---|---|---|---|---|
| 0 | $b_8(k)$ | $b_7(k)$ | $b_6(k)$ | $b_5(k)$ | $b_4(k)$ | $b_3(k)$ | $b_2(k)$ | $b_1(k)$ |
| 1 | $b_4(k)$ | $b_3(k)$ | $b_2(k)$ | $b_1(k)$ | $b_8(k)$ | $b_7(k)$ | $b_6(k)$ | $b_5(k)$ |

Fig. 8 (Prior Art)

Truth table for the rotate-by-0/2 demultiplexer [50]

| $c_2(k)$ | $n_8(k)$ | $n_7(k)$ | $n_6(k)$ | $n_5(k)$ | $n_4(k)$ | $n_3(k)$ | $n_2(k)$ | $n_1(k)$ |
|---|---|---|---|---|---|---|---|---|
| 0 | $m_8(k)$ | $m_7(k)$ | $m_6(k)$ | $m_5(k)$ | $m_4(k)$ | $m_3(k)$ | $m_2(k)$ | $m_1(k)$ |
| 1 | $m_2(k)$ | $m_1(k)$ | $m_8(k)$ | $m_7(k)$ | $m_6(k)$ | $m_5(k)$ | $m_4(k)$ | $m_3(k)$ |

Fig. 9 (Prior Art)

Truth table for the rotate-by-0/1 demultiplexer [52]

| $c_1(k)$ | $d_8(k)$ | $d_7(k)$ | $d_6(k)$ | $d_5(k)$ | $d_4(k)$ | $d_3(k)$ | $d_2(k)$ | $d_1(k)$ |
|---|---|---|---|---|---|---|---|---|
| 0 | $n_8(k)$ | $n_7(k)$ | $n_6(k)$ | $n_5(k)$ | $n_4(k)$ | $n_3(k)$ | $n_2(k)$ | $n_1(k)$ |
| 1 | $n_1(k)$ | $n_8(k)$ | $n_7(k)$ | $n_6(k)$ | $n_5(k)$ | $n_4(k)$ | $n_3(k)$ | $n_2(k)$ |

Fig. 10 (Prior Art)

Truth table for the mirroring demultiplexer [104]

| $r(k)$ | $b_8(k)$ | $b_7(k)$ | $b_6(k)$ | $b_5(k)$ | $b_4(k)$ | $b_3(k)$ | $b_2(k)$ | $b_1(k)$ |
|---|---|---|---|---|---|---|---|---|
| 0 | $h_8(k)$ | $h_7(k)$ | $h_6(k)$ | $h_5(k)$ | $h_4(k)$ | $h_3(k)$ | $h_2(k)$ | $h_1(k)$ |
| 1 | $h_1(k)$ | $h_2(k)$ | $h_3(k)$ | $h_4(k)$ | $h_5(k)$ | $h_6(k)$ | $h_7(k)$ | $h_8(k)$ |

Truth table for the combination of [56] and [104] for $r(k) = 1$

| $d(k)$ | $b_8(k)$ | $b_7(k)$ | $b_6(k)$ | $b_5(k)$ | $b_4(k)$ | $b_3(k)$ | $b_2(k)$ | $b_1(k)$ |
|---|---|---|---|---|---|---|---|---|
| 0 | 0 | 0 | 0 | 0 | 0 | 0 | 0 | 0 |
| 1 | 1 | 0 | 0 | 0 | 0 | 0 | 0 | 0 |
| 2 | 1 | 1 | 0 | 0 | 0 | 0 | 0 | 0 |
| 3 | 1 | 1 | 1 | 0 | 0 | 0 | 0 | 0 |
| 4 | 1 | 1 | 1 | 1 | 0 | 0 | 0 | 0 |
| 5 | 1 | 1 | 1 | 1 | 1 | 0 | 0 | 0 |
| 6 | 1 | 1 | 1 | 1 | 1 | 1 | 0 | 0 |
| 7 | 1 | 1 | 1 | 1 | 1 | 1 | 1 | 0 |
| 8 | 1 | 1 | 1 | 1 | 1 | 1 | 1 | 1 |

IDLE-TONE-FREE MISMATCH-SHAPING ENCODERS

1 CROSS REFERENCE TO RELATED APPLICATIONS

This invention is based on and claims priority from U.S. Provisional Patent Application No. 60/115,282 filed Jan. 6, 1999.

2 BACKGROUND—FIELD OF INVENTION

The field of invention is data conversion, more precisely, this invention relates to oversampled mismatch-shaping digital-to-analog converters.

3 BACKGROUND—DESCRIPTION OF PRIOR ART

In electronic circuits, signal processing is most efficiently implemented when the signals are represented digitally. Real-world signals are analog, and the conversion between analog and digital signals is, therefore, an important application. The following discussion centers around the implementation of digital-to-analog (D/A) converters, which may be used either directly for the D/A conversion of digital signals, or as an important element for the implementation of analog-to-digital (A/D) converters.

3.1 Binary-Weighted D/A Converters

A thorough discussion of the ideal operation of and several techniques for the implementation of D/A converters can be found in a Ph.D. thesis by Jesper Steensgaard [*High-Performance Data Converters*, Ph.D. thesis by Jesper Steensgaard, Jan. 20, 1999, The Technical University of Denmark, Lyngby Denmark]. D/A converters are often implemented by separating the digital input signal d(k) into a sum of digital subsignals $d(k)=d_1(k)+d_2(k)+\ldots+d_N(k)$ which are D/A converted individually, thereby generating the analog subsignals $a_1(k), a_2(k), \ldots, a_N(k)$. The overall analog output signal a(k) is the sum of the analog subsignals, $a(k)=a_1(k)+a_2(k)+\ldots+a_N(k)$. In the ideal case, the analog subsignals are proportional to the corresponding digital subsignals, i.e. $a_i(k)=Kd_i(k)$, $i \in \{1, 2, \ldots, N\}$, where K is the same dimensional constant (for example 1 milli Volt or 1 micro Ampere) for all the subsignals. In that case the operation is considered to be ideal $a(k)=Kd(k)$. Offsets are often acceptable.

For ease of implementation, the digital subsignals will typically be of low resolution, i.e., the digital subsignals $d_i(k)$ are sequences of values selected from sets $S_i$ consisting of each only a few elements. For example, binary-weighted D/A converters are very simple D/A converters that separate the digital input signal d(k) bitwise into digital subsignals $d_i(k)$, which each attain only two values, $S_i=\{0, k_i\}$, the difference of which, $k_i$, is proportional to a power of two, $2^i$. Binary-weighted D/A converters operate by letting each two-level digital subsignal turn on or off an analog source which is scaled according to $k_i$, whereby the analog subsignals $a_i(k)$ are generated. To simplify the summation of the analog subsignals, the analog sources will typically be charge or current sources. FIG. 1 shows a typical 4-bit binary-weighted current-steering D/A converter with gain K=1 mA.

3.2 Errors Caused by Mismatch of the Analog Sources

Electrical parameters are unfortunately not well controlled in the processing of integrated electrical circuits. Thus, the gains $K_i$ of the sub D/A converters will generally not all attain their nominal value K, nor will they match perfectly their nominal ratios. This implies that a typical binary-weighted D/A converter is not fully described by the gain factor K because, for any gain value $\hat{K}$, the error $e(k)=a(k)-d(k)\hat{K}$ will be a nonconstant function of the digital input signal d(k). In other words, the D/A converter is characterized by a nonlinear behavior, which is undesirable.

FIG. 2 shows an example of an unit-element D/A converter. Unit-element D/A converters have the property that the digital input signal d(k) is separated into digital subsignals $d_i(k)$ which all attain only values from the same set S consisting of only two elements, say 0 and 1. Hence, the analog sources used to implement the sub D/A converters all have the same nominal value; they are called unit elements. Unit-element D/A converters based on deterministic and time-invariant digital encoders [32] are characterized by a good local linearity (the so-called differential nonlinearity), but the overall/absolute linearity (the so-called integral nonlinearity) is equivalent to that of binary-weighted D/A converters.

3.3 Mismatch-Matching D/A Converters

As opposed to binary-weighted D/A converters, the digital subsignals $d_i(k)$ used in unit-element D/A converters are not necessarily uniquely defined functions of the digital input signal d(k). Consider the 5-level unit-element D/A converter shown in FIG. 2. If, for example, the digital input signal d(k) has the value 1, then the digital encoder [32] can assign the value 1 to any one of the 4 digital subsignals $d_i(k)$, and thus, assign the value 0 to the other 3 digital subsignals. In other words, for d(k)=1, the correct nominal operation can be achieved in 4 different ways. Similarly, when the digital input signal d(k) has either the value 2 or 3, the nominal operation can be achieved in respectively 6 and 4 different ways. The digital subsignals $d_i(k)$ are uniquely defined when the value of the digital input signal d(k) is either 0 or 4.

D/A converters, for which the nominally correct analog output signal can be generated in multiple ways, and for which harmonic distortion due to mismatch of electrical parameters is avoided by alternating between the multiple options, are said to be mismatch-shaping.

3.3.1 Randomized-Scrambling Encoders

L. Richard Carley explained ["A Noise-Shaping Coder Topology for 15+ Bit Converters", L. Richard Carley, *IEEE Journal of Solid-State Circuits*, Vol. 24, No. 2, April 1989] that if the digital encoder [32] for every new input sample selects randomly one of the valid combinations, then the unit-element D/A converter will be perfectly linear. Carley proposed an implementation, shown in FIG. 3, where a thermometer-type digital encoder [36] is followed by a butterfly-type randomizing scrambler [38]. The thermometer-type digital encoder [36] generates the digital intermediate signals, $b_1(k), b_2(k), b_3(k)$, and $b_4(k)$, according to the deterministic, memoryless, and time-invariant operation expressed by the truth table shown in FIG. 4. The randomizing scrambler [38] generates the digital subsignals $d_i(k)$ by randomly (or, more generally, pseudo-randomly) interchanging the intermediate signals $b_i(k)$. In other words, the subsignals are randomly generated permutations of the intermediate signals. Carley explained that a unit-element DAC based on this type of randomized-scrambling digital encoder [34] will be perfectly linear and have a gain which is exactly the average value of the employed sub D/A converters' gains.

Instead of harmonic distortion, the overall analog output signal a(k) will include a stochastic signal component e(k) (noise) having uniform spectral power density (similar to white noise). The Nyquist-band power of e(k) is proportional to the mismatch of the employed analog sources. For example, if the relative mismatch of the analog sources is in the order of 0.1%, which is a typical value, then the analog output signal a(k) will have a signal-to-noise ratio (SNR) of approximately 60 dB when evaluated in the Nyquist frequency range. Usually D/A converters are operated somewhat oversampled, i.e., the sampling frequency $f_s$ is usually more than twice the considered signal bandwidth $f_b$, in which case the inband SNR will be somewhat better than 60 dB. However, the inband SNR performance is improved only 10 dB for each ten-fold increase of the oversampling ratio (OSR=$f_s/(2f_b)$). Thus, 100 dB performance requires in the order of 10,000 times oversampling, which usually is not feasible.

Randomized-scrambling unit-element encoders are said to be zero-order mismatch-shaping because the error signal is not suppressed in the signal band.

3.3.2 Element-Rotation-Scheme (ERS) Encoders

U.S. Pat. No. 5,138,317 to Michael J. Story describes that by generating the digital subsignals as a certain function of the present and previous samples of the digital input signal d(k), the unit-element D/A converter will be perfectly linear and have a much better low-frequency performance than randomized-scrambling encoders.

The general idea is to use the analog sources equally often, even when evaluated over short time periods. Story proposed that the analog sources be considered mapped onto an oriented circle and used sequentially (like the digits on a conventional clock), whereby the difference between the number of times that each analog source has been used will always be zero or one. This concept, which is called the element-rotation scheme (ERS), is illustrated in FIG. 5 for a sequence of 10 samples. It can be observed that the selection of which unit elements to use is uniquely defined by 1. the orientation of the rotation (which is always the same),
2. the first element to use for the D/A conversion of the present sample (the so-called rotation pointer, which in FIG. 5 is shown with a shade), and
3. the number of elements to use (i.e., the value of d(k)).

FIG. 7 shows a simple state machine implementing an ERS digital encoder [40] for use in a 8-unit-element ERS D/A converter. It is based on the observation that the rotation pointer can be calculated as the integral (summation) of the digital input signal d(k) modulo the number of unit elements, which in this case is 8. It is assumed that the digital input signal d(k) is binary encoded and restricted to attain only integer values in the range from 0 through 8, including both the values 0 and 8. A 3-bit adder [42] and a delay element [44] implement the operation of a delaying integrator for which the output, i.e., the rotation pointer $c(k)=c_1(k)+c_2(k)+c_3(k)$, is calculated modulo 8. The modulo-8 operation is obtained by discarding any overflow information, which usually is represented by the adder's [42] "carry-out bit" (not shown). A binary-to-thermometer (B2T) encoder [46] produces 8 intermediate signals, $b_1(k), b_2(k), \ldots, b_8(k)$, each having either the value 0 or 1, according to the truth table shown in FIG. 6. The sum of the $b_i(k)$ signals equals d(k), and the highest index of the nonzero $b_i(k)$ signals equals d(k). The rotation pointer c(k) represents how much the thermometer code generated by the B2T encoder [46] is to be rotated. The rotation operation is implemented in 3 steps using 3 demultiplexers [48],[50], and [52]. The rotation pointer's most significant bit, $c_3(k)$, will attain only the values 0 and 4. It controls the rotate-by-0/4 demultiplexer [48] which generates 8 signals $m_i(k)$ as a rotated (by 0 or 4 tabs) permutation of the $b_i(k)$ signals. The rotate-by-0/4 demultiplexer's [48] operation is described by the truth table shown in FIG. 8. The rotation pointer's two less significant bits, $c_2(k)$ and $c_1(k)$, will attain values 0/2 and 0/1 respectively. They are used to control the demultiplexers [50] and [52] which generate the digital subsignals $d_i(k)$ as rotated perturbations of the signals $m_i(k)$ provided by the rotate-by-0/4 demultiplexer [48]. The truth tables for these demultiplexers [50] and [52] are shown in FIGS. 9 and 10.

3.4 Idle Tones in Mismatch-Shaping Unit-Element D/A Converters

It can be shown that the error signal $e(k)=a(k)-\hat{K}d(k)$ from an ERS mismatch-shaping D/A converter is the first-order difference of a signal s(k), i.e., $e(k)=s(k)-s(k-1)$. The signal s(k) is a deterministic, memoryless, time-invariant, and nonlinear function of the rotation pointer c(k). More precisely, the value of s(k) depends only on the instant value of c(k). The static, but generally unknown, relationship between s(k) and c(k) reflects the mismatch of the analog sources in a specific implementation (two implementations will generally not be characterized by the same relationship, as they represent two outcomes of a stochastic process).

Many derivations used to analyze ERS D/A converters are based on the assumption that s(k) has uniform spectral power density, which is desirable. This assumption may be justifiable if the rotation pointer c(k) is a broadband signal that does not include any tones. However, due to the very simple relationship between the input signal d(k) and the rotation pointer c(k), periodicity/tonality of d(k) unfortunately, but usually, implies that c(k) will have a nonuniform autocorrelation function, i.e., the assumption is not justified. Considering that d(k) is the signal to be D/A converted, which for a wide range of applications will be periodic or at least pseudo-periodic (i.e., include short-term patterns), it should be understood that the above assumption is likely to lead to misleading predictions of the D/A converter's performance.

FIGS. 11, 12, and 13 shows the simulated spectral composition of a 16-unit-element ERS D/A converter's error signal e(k), when it is applied different types of input signals d(k). FIG. 11 shows the performance for a periodic input signal. In this example, d(k) was a sinusoid signal which was truncated to 4-bit resolution by simply neglecting the least significant bits (LSBs). Clearly, the error signal e(k) is composed of only discrete tones, which is highly undesirable. The D/A converter's 4-bit resolution is too coarse for most practical applications, and hence d(k) will generally be the output from a multibit delta-sigma ($\Delta\Sigma$) modulator. The $\Delta\Sigma$ modulator is used to interpolate a high-resolution oversampled signal into a lower-resolution representation d(k). Even for periodic input signals, the $\Delta\Sigma$ modulator will generate an aperiodic output signal d(k). This property reflects that the $\Delta\Sigma$ modulator's input and output signals are equivalent in the signalband only. In other words, the $\Delta\Sigma$ modulator's input signal is truncated to a lower resolution output signal d(k) by adding an aperiodic noise-like signal component, which has negligible power in the signal band. The inclusion of an aperiodic signal component tends to spectrally spread the rotation pointer's energy, but as shown in FIG. 12, the ERS D/A converter's error signal can be tonal even when it is driven by a $\Delta\Sigma$ modulator.

Such tones are called idle tones. Idle tones are indeed a problem to be concerned about because they may significantly deteriorate the SNR performance. The significance of the SNR degradation is exemplified by FIG. 4 in a paper by Fujimori ["A 1.5 V 4.1 mW Dual Channel Audio Delta-Sigma D/A Converter", Ichiro Fujimori and Tetsuro Sugimoto, *IEEE Journal of Solid-State Circuits,* Vol. 33, No. 12, December 1998]. Clearly, the signals produced by $\Delta\Sigma$ modulators may not be sufficiently aperiodic to avoid the deleterious effects from idle tones.

FIG. 13 shows the error signal's spectral composition when the input signal d(k) is a white-noise random signal. The error signal's e(k) spectral power density is approximately proportional to the frequency, which is the desired performance. Unfortunately, only few applications require D/A conversion of random signals, and hence ERS D/A converters will generally suffer from idle-tone problems.

3.4.1 Dithered Mismatch-Shaping Unit-Element D/A Converters

U.S. Pat. No. 5,404,142 to Bob Adams describes an alternative mismatch-shaping encoder (called a mismatch-shaping butterfly scrambler) which tends to produce less idle tones than ERS encoders. Similarly, U.S. Pat. No. 5,684,482 to Ian Galton describes a tree-structured digital encoder which also tends to produce less idle tones than ERS encoders. Both Adams and Galton describe so-called dithering techniques, which can make their respective encoders virtually idle-tone-free. These dithering techniques are efficient, but they can be used only with the respective encoders, which are significantly more complex to implement than, for example, ERS encoders.

Louis A. Williams described [*An Audio DAC with 90 dB Linearity using MOS to Metal-Metal Charge Transfer*, Louis A. Williams III, Digest of Technical Papers for the IEEE 1998 International Solid-State Circuits Conference, Vol. 41, San Francisco, Feb. 5,6, and 7, 1998] a mismatch-shaping encoder, which he called a grouped-level-averaging (GLA) encoder, that consists of three ERS encoders multiplexed as a function of the input signal. GLA encoders are fairly simple to implement, and they tend to produce less idle tones than ERS encoders. GLA encoders, however, are not entirely idle-tone-free, and an efficient dithering technique has not been suggested.

4 SUMMARY

In accordance with the present invention, idle tones in mismatch-shaping encoders can be suppressed by randomly permuting the digital subsignals whenever the encoder encounters a state for which the accumulated error is zero.

4.1 Objects and Advantages

Accordingly, several objects and advantages of the present invention are to provide a low-complexity mismatch-shaping encoder for use with unit-element D/A converters;

to provide a mismatch-shaping encoder which, when used to drive a unit-element D/A converter, does not produce deleterious idle tones;

to provide a mismatch-shaping encoder which is more efficient than GLA encoders in the sense that the error signal comprises relatively less power in the signal band;

to provide a dithering technique which can be used to suppress idle tones in any type of mismatch-shaping encoder;

to provide a dithering technique which can be used for mismatch-shaping encoders that minimize the error signal in any predefined frequency range.

Further objects and advantages will become apparent from a consideration of the ensuing description and drawings.

5 DRAWING FIGURES

FIG. 6 shows the truth table for a 9-level thermometer-type encoder (PRIOR ART).

FIG. 8 shows the truth table for the rotate-by-0/4 demultiplexer used for the implementation of the ERS encoder shown in FIG. 7 (PRIOR ART).

FIG. 9 shows the truth table for the rotate-by-0/2 demultiplexer used for the implementation of the ERS encoder shown in FIG. 7 (PRIOR ART).

FIG. 10 shows the truth table for the rotate-by-0/1 demultiplexer used for the implementation of the ERS encoder shown in FIG. 7 (PRIOR ART).

FIG. 20 shows the truth table for a mirrored thermometer-type encoding.

5.1 REFERENCE NUMERALS IN DRAWINGS

[32]: Digital encoder
[34]: Randomized scrambling digital encoder
[36]: Thermometer-type digital encoder
[38]: Butterfly-type randomizing scrambler
[40]: Element-rotation-scheme (ERS) mismatch-shaping encoder
[44]: Delay element
[42]: 3-bit adder (for binary-encoded signals)
[46]: Binary-to-thermometer encoder
[48]: Rotate-by-0/4 demultiplexer

[50]: Rotate-by-0/2 demultiplexer
[52]: Rotate-by-0/1 demultiplexer
[54]: Mismatch-shaping encoder
[56]: Binary-to-thermometer encoder; equivalent to [46]
[58]: Rotate-by-0/4 demultiplexer; equivalent to [48]
[60]: Rotate-by-0/2 demultiplexer; equivalent to [50]
[62]: Rotate-by-0/1 demultiplexer; equivalent to [52]
[64]: Control system calculating c(k)
[66]: 3-bit adder (for binary-encoded signals)
[68]: (First) 3-bit delay element with 3-state outputs
[70]: (Second) 3-bit delay element with 3-state outputs
[72]: Randomizing control unit
[74]: Clock generator
[76]: Random generator
[78]: 3-state output stage
[80]: 3-state output stage
[82]: Array of 3 level-sensitive D-latches
[84]: Array of 3 level-sensitive D-latches
[86]: Array of 3 level-sensitive D-latches
[88]: Array of 3 level-sensitive D-latches
[90]: Logic gates
[92]: Restricted random generator
[94]: Random generator
[96]: Digital state machine
[98]: Mismatch-shaping encoder
[100]: Control system calculating c(k)
[102]: Restricted randomizing control unit
[104]: Mirroring demultiplexer
[106]: Array of EXCLUSIVE-OR logic gates
[108]: Flip-coin random generator
[110]: Digital state machine
[112]: Mismatch-shaping encoder
[114]: Permutation circuit
[116]: Scrambler
[118]: Mirroring demultiplexer; equivalent to [104]
[120]: Rotate-by-0/4 demultiplexer; equivalent to [46]
[122]: 3-input AND gate
[124]: Digital state machine
[126]: Random generator providing 2 independent flip-coin random signals

6 DESCRIPTION—FIRST EMBODIMENT

Figure 14:
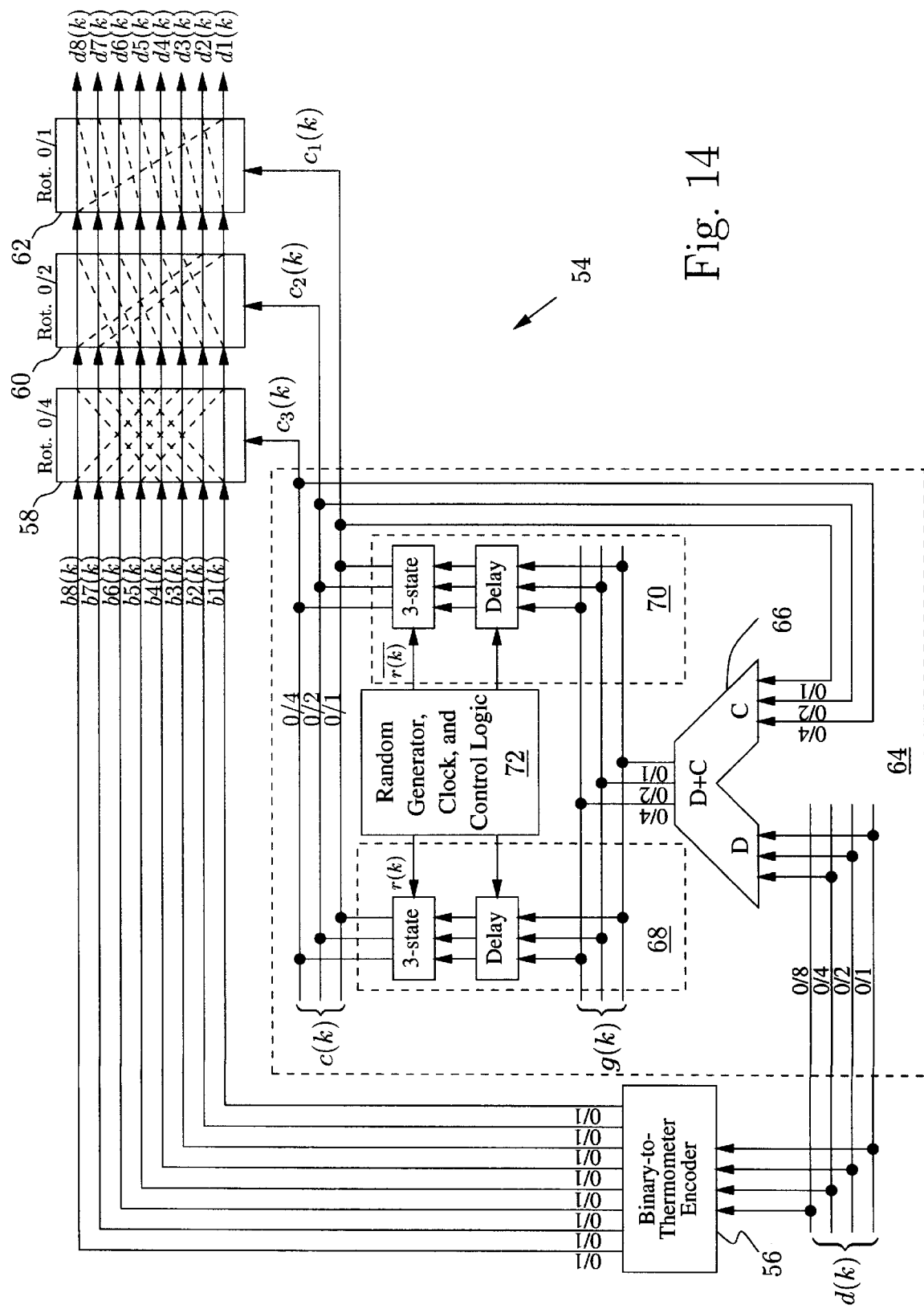
FIG. 14 shows a first embodiment of this invention.

FIG. 14 shows an implementation of a mismatch-shaping encoder [54] according to the present invention. It is partially based on the implementation of ERS encoders [40] discussed above (FIG. 7). The digital input signal d(k), which is assumed to be binary-encoded and restricted to attain only the values 0,1,2,3,4,5,6,7, and 8, is binary-to-thermometer encoded by a B2T encoder [56]. The thereby generated intermediate signals $b_i(k)$ are rotated according to the value of a rotation pointer c(k) using demultiplexers [58], [60], and [62]. The B2T encoder [56] and the demultiplexers [58], [60], and [62] are identical to the B2T encoder [46] and the demultiplexers [48], [50], and [52] shown in FIG. 7; they are described by the truth tables shown in FIGS. 6, 8, 9, and 10. However, the way the rotation pointer c(k) is calculated is novel.

The control system [64] consists of a 3-bit adder [66], 2 delay elements [68] and [70] with 3-state outputs, and a randomizing control unit [72]. In every sample, the randomizing control unit [72] makes a decision to use either the first delay element [68] or the second delay element [70]. The selected delay element's output stage is activated (the other delay element will have high-impedance outputs), and it is the only delay element which is clocked in that sample. If, for example, the first delay element [68] is selected in every sample, then the encoder's [54] operation is equivalent to that of the ERS encoder [40] shown in FIG. 7, and the value stored in the second delay element [70] will remain constant. Similarly, if the second delay element [70] is selected in every sample, then the encoder [54] will operate as an ERS encoder [40], and the value stored in the first delay element [68] will remain constant. The control unit [72] generates a selector signal r(k). The first delay element [68] is activated/clocked only when r(k)=1, and the second delay element [70] is activated/clocked only when r(k)=0, i.e., when $\overline{r(k)}$=1.

The digital subsignals $d_i(k)$ can be construed as generated by calculating the bitwise OR function of the digital sub signals from two ERS encoders [40]; the first ERS encoder having the input signal d(k)·r(k), and the second ERS encoder having the input signal d(k)·$\overline{r(k)}$. Hence, if r(k) is a deterministic, time-invariant, and memoryless function of d(k), then the encoder [54] is just a particularly simple way to implement a GLA encoder (GLA encoders are prior art and were discussed above). However, in this first embodiment, the selector signal r(k) is generated as a flip-coin random signal. A flip-coin random signal is in this context defined as a stochastic signal which can attain only two values, 0 and 1; for which there is a 0.5 probability that the outcome will be 1; and for which each sample represents an independent stochastic experiment. The major advantage of using a flip-coin random signal r(k), as opposed to the operation of GLA encoders, is that both d(k)·r(k) and d(k)·$\overline{r(k)}$ will have a uniform spectral power density. In other words, neither d(k)·r(k) nor d(k)·$\overline{r(k)}$ will be periodic, or even pseudo-periodic, and hence neither of the two individual ERS encoders will produce idle tones. Furthermore, the combination of the two ERS encoders, i.e., the proposed mismatch-shaping encoder [54], will not produce idle tones either. This is a consequence of the property that any one of the digital subsignals $d_i(k)$ will be an aperiodic signal. Clearly, random alternation between two mismatch-shaping encoders of arbitrary type will be equally efficient; the use of ERS encoders is the simplest known option. The concept works also for bandpass mismatch-shaping encoders.

6.1 Detailed Discussion of the Implementation

Figure 15:
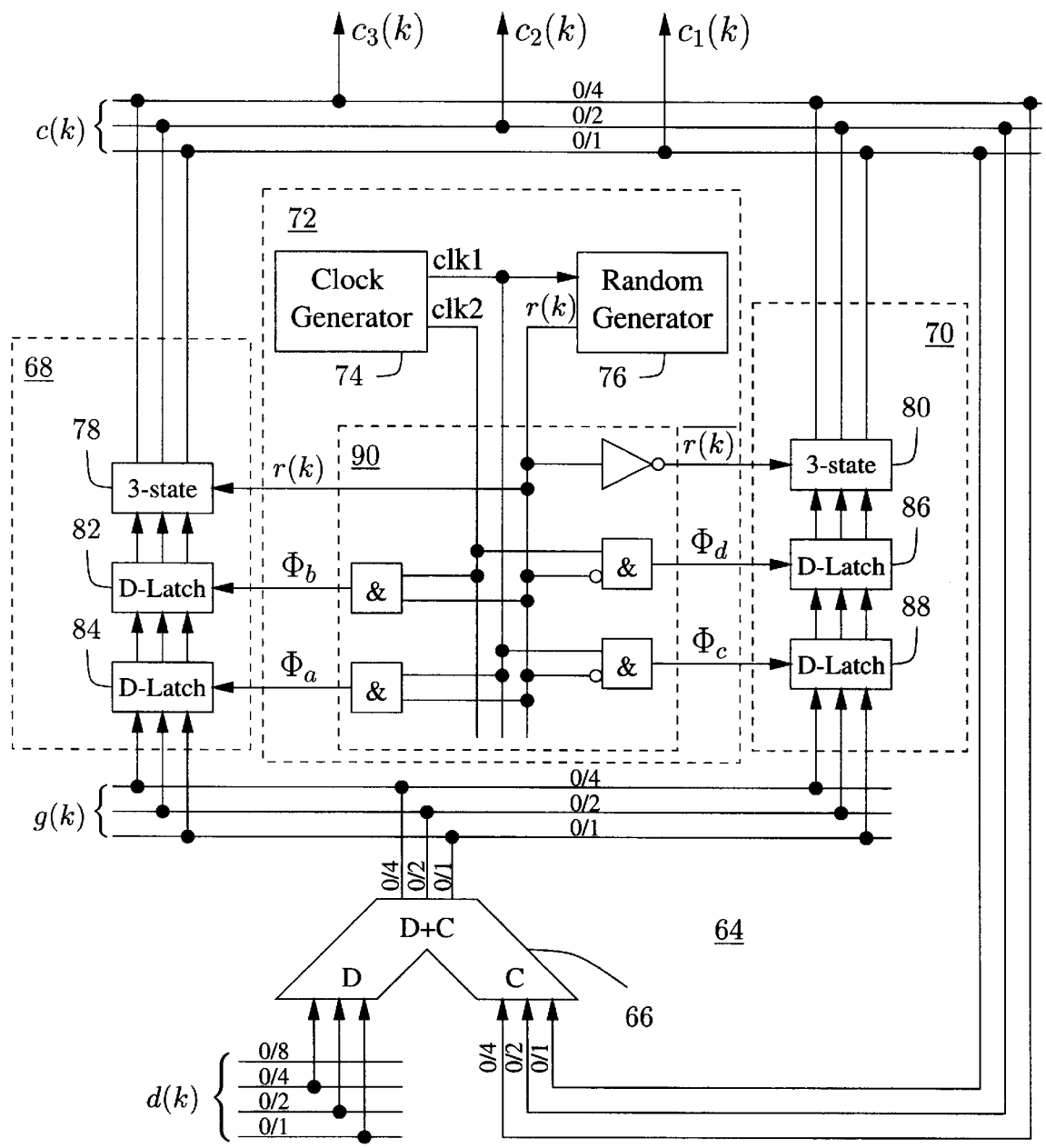
FIG. 15 shows in detail the control system employed in the first embodiment.
Figure 16:
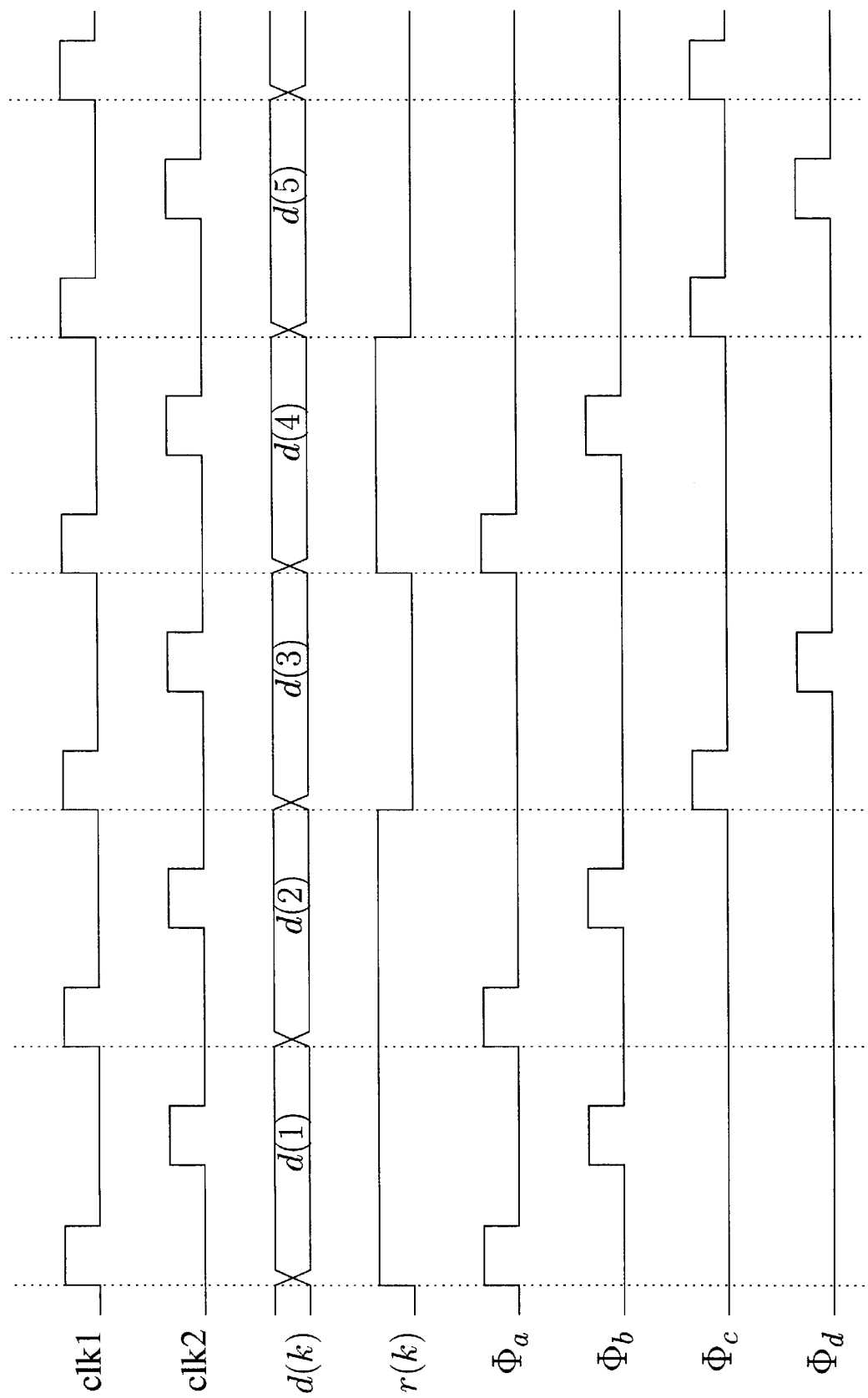
FIG. 16 shows the clock phases used in all discussed embodiments of this invention.

FIG. 15 shows in detail how the control system [64] can be implemented. A clock generator [74] (synchronized with the input signal d(k)) generates the non-overlapping clock signals 'clk1' and 'clk2' shown in FIG. 16. The random generator [76] generates the selector signal r(k), which in the ideal case is a true flip-coin random signal. The exact stochastic properties of r(k), however, are not crucial for the performance, and the random generator [76] may be implemented, for example, as a simple linear-feedback-shift-registers (LFSR) pseudo-random generator, or otherwise. The selector signal r(k), as well as d(k), is updated at the rising edges of the clock signal 'clk1'. In FIG. 16 the selector signal r(k) is represented by a 110100 sequence.

The two delay elements [68] and [70] consist of two 3-state output stages [78] and [80] and four arrays of level-sensitive D-latches [82], [84], [86], and [88]. The first layer of D-latches [84] and [88], of which the inputs are connected to the outputs of the 3-bit adder [66], are controlled by clock signals $\Phi_a$ and $\Phi_c$. The clock signals $\Phi_a$ and $\Phi_c$ are generated by calculating the AND operation of 'clk1' and r(k) and $\overline{r(k)}$, respectively. The second layer of D-latches [82] and [86], of which the inputs are connected to the outputs of the first layer of D-latches [84] and [88], are controlled by clock signals $\Phi_b$ and $\Phi_d$. The clock signals $\Phi_b$ and $\Phi_d$ are generated by calculating the AND operation of 'clk2' and r(k) and $\overline{r(k)}$, respectively. The second layer of D-latches [82] and [86] has 3-state output stages [78] and

Figure 17:
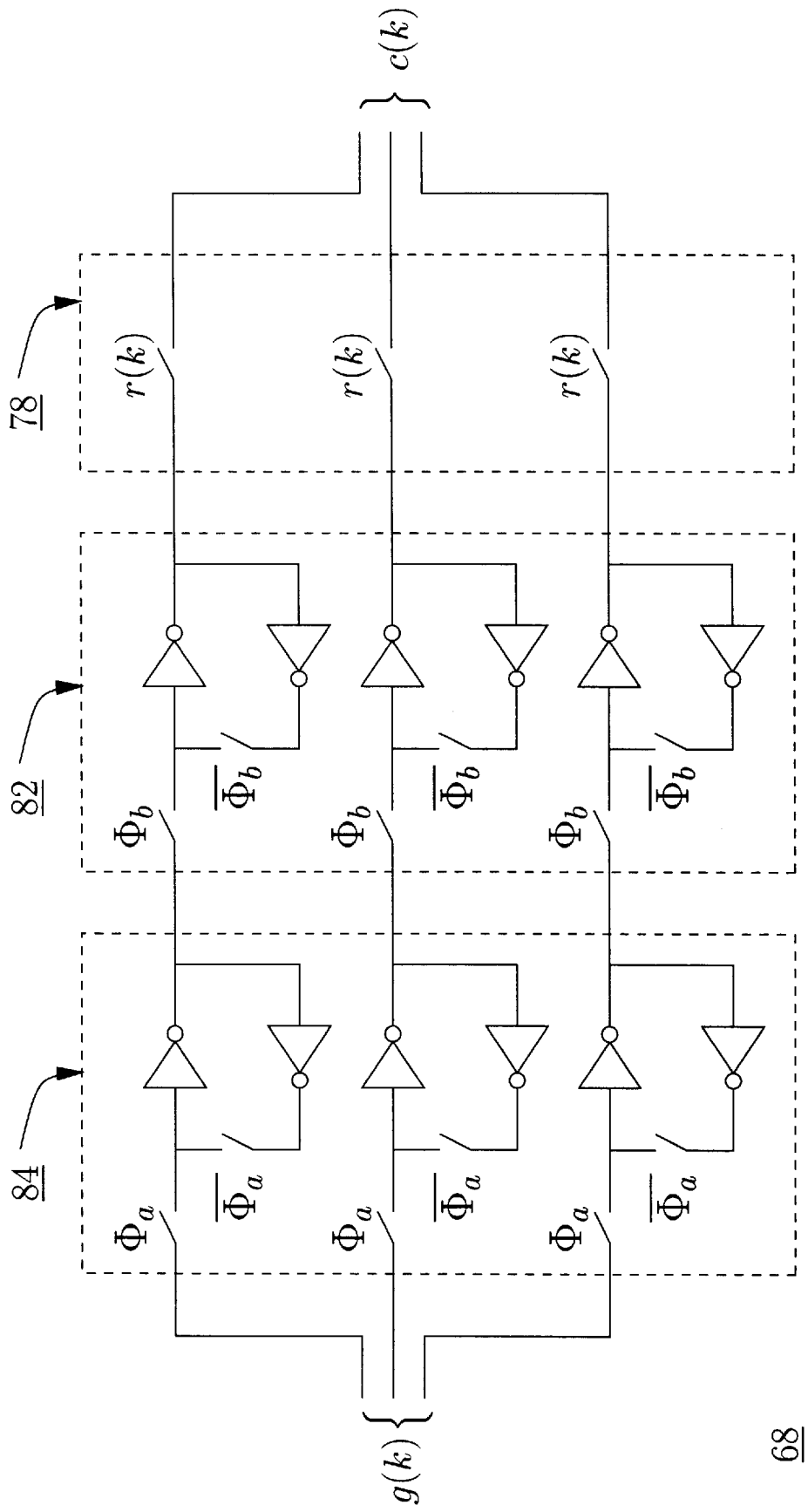
FIG. 17 shows a 3-bit delay element with a 3-state output stage.

[80], which are controlled by r(k) and $\overline{r(k)}$, respectively. The clock signals $\Phi_a$, $\Phi_b$, $\Phi_c$, $\Phi_d$, and $\overline{r(k)}$ are generated using logic gates [90]. FIG. 17 shows a detailed implementation of the first delaying element [68]. The second delaying element [70] is implemented similarly.

Skew of the selector signal r(k) relative to 'clk1' may cause false spikes in $\Phi_a$ and $\Phi_c$, and that may unintentionally strobe the first layer of D-latches [84] and [88]. It is, however, simple to avoid false spikes in $\Phi_b$ and $\Phi_d$, and the second layer of D-latches [82] and [86] will, therefore, be strobed only when their input signals are valid. Thus, the state variables representing the state of the two ERS encoders are stored in the second layer of D-latches [82] and [86] rather than in the first layer of D-latches [84] and [88].

Notice that the output from the two delay elements [68] and [70] is valid only from the rising edge of 'clk1' to the rising edge of 'clk2.' Hence, the digital subsignals $d_i(k)$ will be valid only in the same periods of time. If the application requires that the digital subsignals $d_i(k)$ must be valid in the entire clock period, as is the case for current-steering unit-element D/A converters, it can be obtained by latching either c(k) or the digital subsignals $d_i(k)$ (preferred) with an array of level-sensitive D-latches clocked by 'clk1' (not shown).

7 DESCRIPTION—SECOND EMBODIMENT

In the above-mentioned Ph.D. thesis by Jesper Steensgaard it was argued that unit-element mismatch-shaping encoders are most efficient when the input signal d(k) is a random signal with average value equal to half the encoder's number of unit elements, i.e., 4 for the mismatch-shaping encoder [54] shown in FIG. 14. For example, for ERS encoders, this will allow the rotation pointer to travel freely and randomly among the available eight states. If d(k) is mainly very close to 0 or 8 (the number of unit elements), the performance will be degraded.

It should be understood that by switching between two or more mismatch-shaping encoders, as is the case for GLA encoders as well as for the first embodiment of this invention, the performance will not be quite as good as for ERS encoders [40]. This is the tradeoff for avoiding idle tones. Clearly, the more encoders involved, the more the performance will be degraded. To suppress idle tones to a reasonable level, GLA encoders should generally be based on 3 or more encoders. The described encoder [54] is based on only two encoders, and it will, therefore, yield a better performance. Furthermore, the proposed encoder [54] is significantly better to suppress idle tones.

Figures 18, 21:
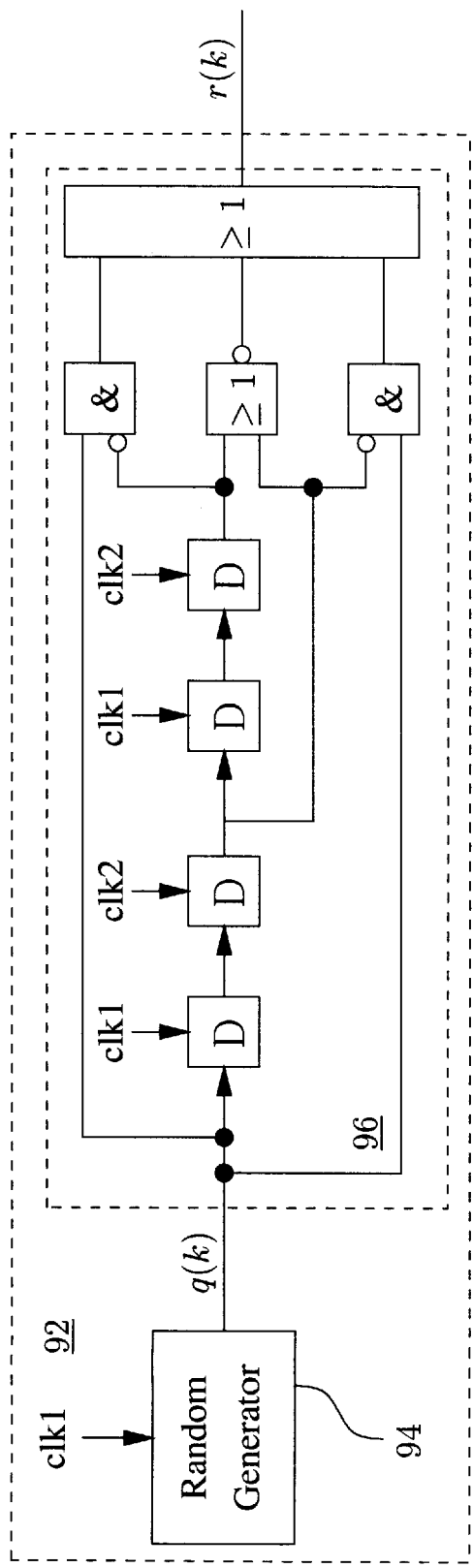
FIG. 18 shows a restricted clock generator used in a second embodiment of this invention.
FIG. 21 shows the truth table for a mirroring demultiplexer.

Simulations indicate that the encoder's [54] performance will be improved if the selector signal r(k) is a restricted random signal. The general idea is to use the two ERS encoders [40] equally often, even when evaluated over short periods of time. However, to avoid periodicity of r(k)·d(k), it is necessary to preserve an element of randomness in r(k). The second embodiment of this invention is identical to the first embodiment (shown in FIGS. 14 and 15), except for the difference that the random generator [76] is replaced by a restricted random generator [92] shown in FIG. 18. The restricted random generator [92] consists of a random generator [94] and a small digital state machine [96]. The random generator [94] generates a signal q(k) which in the ideal case is a flip-coin random signal, but it will typically be an only pseudo-random signal, which is simpler to generate. The digital state machine [96] lets r(k)=q(k) unless if q(k)=r(k−1)=r(k−2), in which case r(k)=$\overline{r(k-1)}$. In other words, the digital state machine [96] assures that all sequences of only zeros or ones are at most two samples long.

Clearly, the randomness of the selector signal r(k) can be restricted in other and more sophisticated ways than described above. For example, it can be assured that $\Sigma_k r(k) \cdot d(k)$ at any time has approximately the same value as $\Sigma_k \overline{r(k)} \cdot d(k)$, or r(k) can be generated by randomly selecting sequences from a set of predefined sequences such as {0101101, 01010}. It should, however, be understood that the more restrictions r(k) is subject to, the more likely idle tones are to occur. The proposed implementation of the restricted random generator [92] seems to provide a good compromise of complexity, idle-tone prevention, and signal-band performance.

8 DESCRIPTION—THIRD EMBODIMENT

Figure 19:
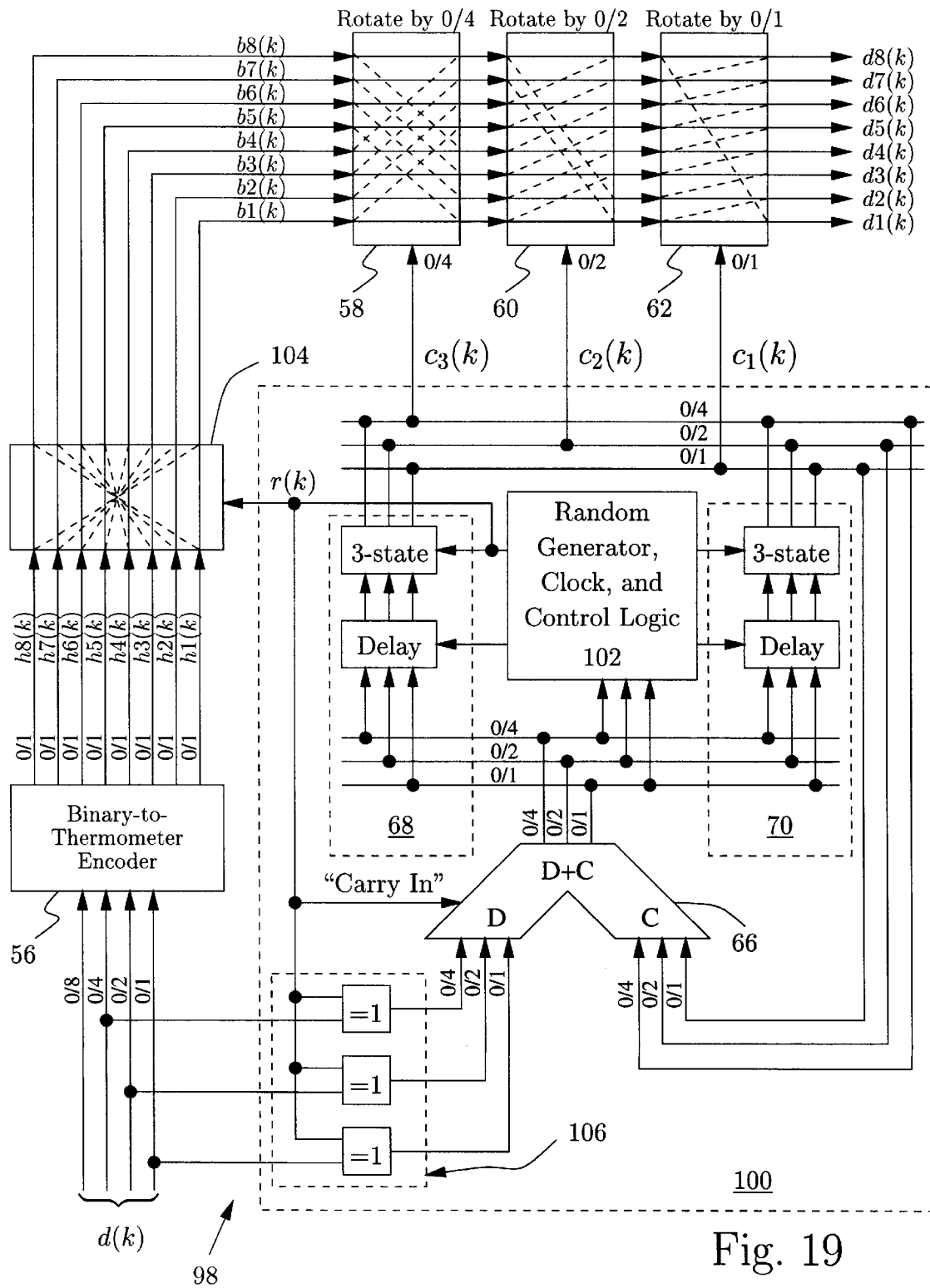
FIG. 19 shows a third embodiment of this invention.

FIG. 19 shows another mismatch-shaping encoder [98], which is a third embodiment of this invention. It is a variation of the encoder [54] shown in FIG. 14. One difference is that the control system [100] now is based on a restricted randomizing control unit [102]. The selector signal r(k) is restricted in the sense that it is allowed to alternate (which it does according to a random process) only when the output from the 3-bit adder [66] has certain values. Another significant feature of this encoder [98] is that the ERS encoder, for which the rotation pointer is stored in the first delay element [68], is based on rotation in the opposite direction as that of the ERS encoder for which the rotation pointer is stored in the second delay element [70]. This feature can be implemented in several ways, for example by using two entirely separate ERS encoders. However, in this third embodiment, rotation in the opposite direction is achieved by 1. generating the intermediate signals $b_i(k)$ to have a thermometer code starting from the other end, i.e., as expressed by the truth table shown in FIG. 20;
2. calculating the rotation pointer (stored in the first delay element [68]) as the modulo-8 accumulation of −d(k)·r(k) as opposed to the modulo-8 accumulation of d(k)·r(k).

To generate the intermediate signals $b_i(k)$ according to the truth table shown in FIG. 6 when r(k)=0, and according to the truth table shown in FIG. 20 when r(k)=1, a mirroring demultiplexer [104] is inserted between the binary-to-thermometer encoder [56] and the rotate-by-0/4 demultiplexer [58]. The operation of the mirroring demultiplexer [104] is described by the truth table shown in FIG. 21. The modulo-8 accumulation of −d(k)·r(k) is implemented by feeding the two's complement of d(k) to the adder [66]. The two's complement of d(k) is obtained by bitwise calculating the EXCLUSIVE-OR operation of d(k) and r(k), and by connecting r(k) to the adder's [66] carry-in terminal. When r(k)=1, the array of EXCLUSIVE-OR gates [106] will invert the bits in the binary code representing d(k); for r(k)=0, it will leave them unaffected.

The advantage of designing the two ERS encoders to rotate in opposite directions is limited if the selector signal r(k) is a flip-coin random signal. A significant advantage can, however, be obtained if the individual encoders are used for the conversion of entire sequences of samples d(k), k∈$W_i$= $\{k_i, k_i+1, k_i+2 \ldots, k_{i+1}-1\}$ for which the sum is an integer multiple of the number of unit elements, i.e., $\text{mod}_8(\Sigma_{k \in W_i} d(k))=0$. Upon the completion of a sequence, d(k), k∈$W_i$, the same ERS encoder may continue with, or the other ERS encoder make take over for, the conversion of the next sequence d(k), k∈$W_{i+1}$. The choice is left for a random process to decide.

This mode of operation implies that when an encoder is deactivated its rotation pointer will always have the same value. This is beneficial because when an ERS encoder has completed an integer number of full rotations, the accumulated error is zero. It is then a good time to deactivate the encoder because there is no previous error that it needs to correct for.

Figure 22:
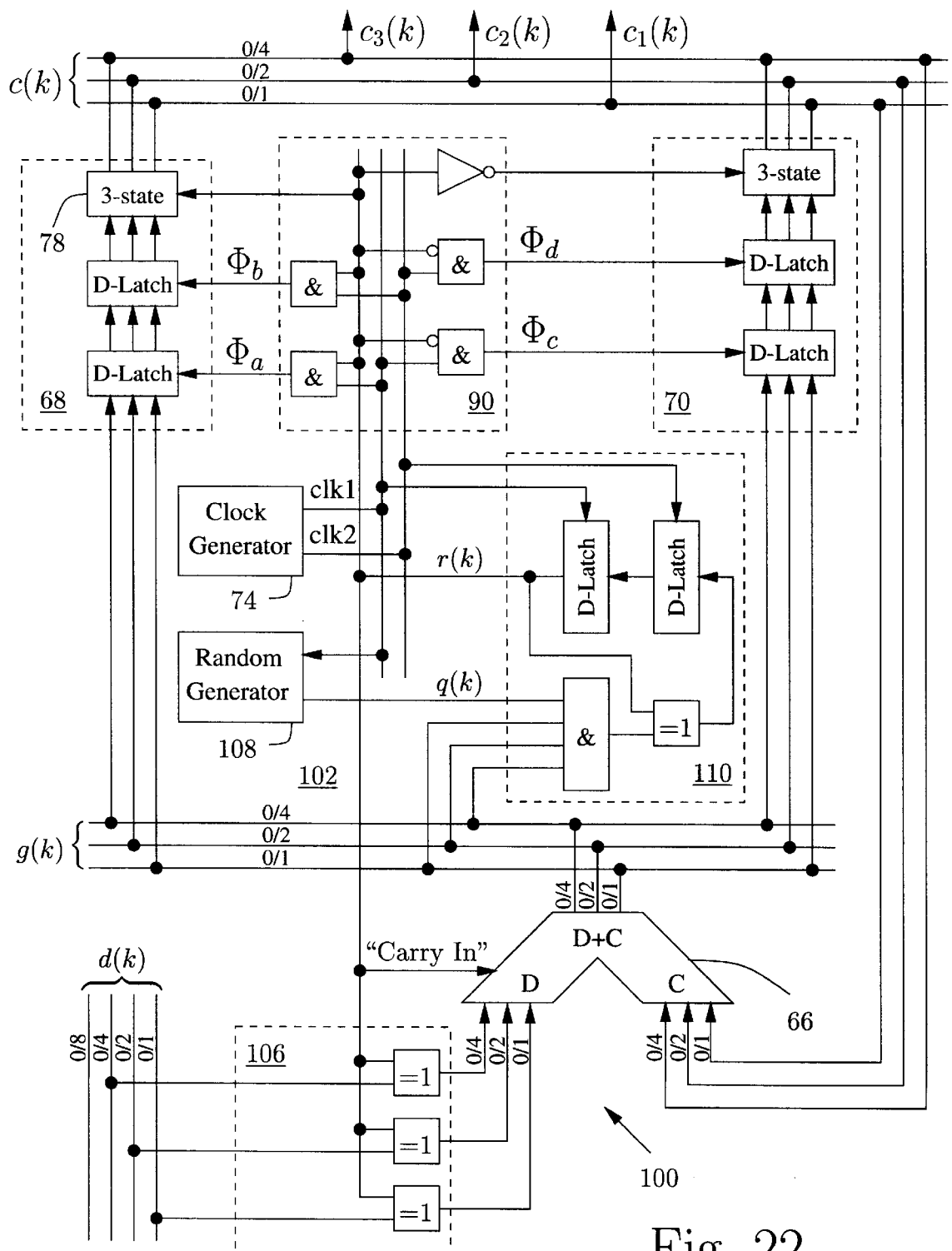
FIG. 22 shows in detail the control system used in the third embodiment.

The desired operation can be expressed as that the value stored in the first delay element [68] is always the same when r(k)=0, and that the value stored in the second delay element [70] is always the same when r(k)=1. The preferred implementation of the control system [100] is shown in FIG. 22. The restricted randomizing control unit [102] consists of a clock generator [74], a random generator [108], the logic gates [90], and a small digital state machine [110]. The random generator [108] generates a signal q(k) which ideally is a true flip-coin random signal. The digital state machine [110] is merely a toggle flip flop, which toggles if q(k)=1 and the signal g(k) provided by the 3-bit adder [66] has a predefined code (a '111' code will cause r(k) to alternate, if q(k)=1).

If the mismatch-shaping encoder [98] controls many unit elements, then it will only rarely occur that g(k) has the predefined code. In that case the randomizing control unit [102] may be too restricted in the sense that idle tones may not be sufficiently suppressed. Hence, for high-resolution encoders [98], it may be preferable to allow r(k) to alternate when g(k) attains any one value in a set of several values. This can be implemented, for example, by not connecting the least significant bit of g(k) to the state machine [110].

9 DESCRIPTION—FOURTH (PREFERRED) EMBODIMENT

When evaluating the encoder [98] shown in FIG. 19, it may be observed that it can be implemented more easily. First, it may be observed that it is not necessary to employ two delay elements [68] and [70]. This is because the inactive delay element, i.e., the first delay element [68] for r(k)=0 and the second delay element [70] for r(k)=1, will always store the same predefined value (assuming that r(k) is allowed to alternate only when g(k) has one specific value). Hence, and now referring to FIG. 22, the control unit [102] can be simplified by eliminating the second delay element [70] and the logic gates [90]. In that case, $\Phi_a$ equals 'clk1,' $\Phi_b$ equals 'clk2,' and the delay element [68] need not have a 3-state output stage [78].

Another important observation is that the direction of rotation can be altered simply by interchanging the digital subsignals $d_i(k)$, rather than employing the EXCLUSIVE-OR gates [106] and the mirroring demultiplexer [104]. The direction of rotation can be changed as a function of the selector signal r(k) by inserting a demultiplexer after the last rotating demultiplexer [62] (illustrated in FIG. 23—discussed later). In other words, the overall complexity is reduced to a single ERS encoder [40], a random generator [108], a small digital state machine [110], and a demultiplexer to permute the digital subsignals $d_i(k)$.

Considering the nature of this system, it may also be observed that it is not necessary to limit the system to employ only two permutations of the digital subsignals $d_i(k)$ (i.e., left and right rotation); any permutation may be used. The important point to keep in mind is that it is only permissible to choose a new permutation when the signal g(k) from the adder [66] attains the predefined value (any value is OK as long as it is constant). Notice that, unlike GLA encoders, the encoder's performance in not degraded by increasing the number of permutations employed; in fact, allowing more permutations will only improve the suppression of idle tones, which is desired. This type of encoders is discussed in more detail in the following.

9.1 Detailed Description of the Preferred Embodiment

Figure 1:
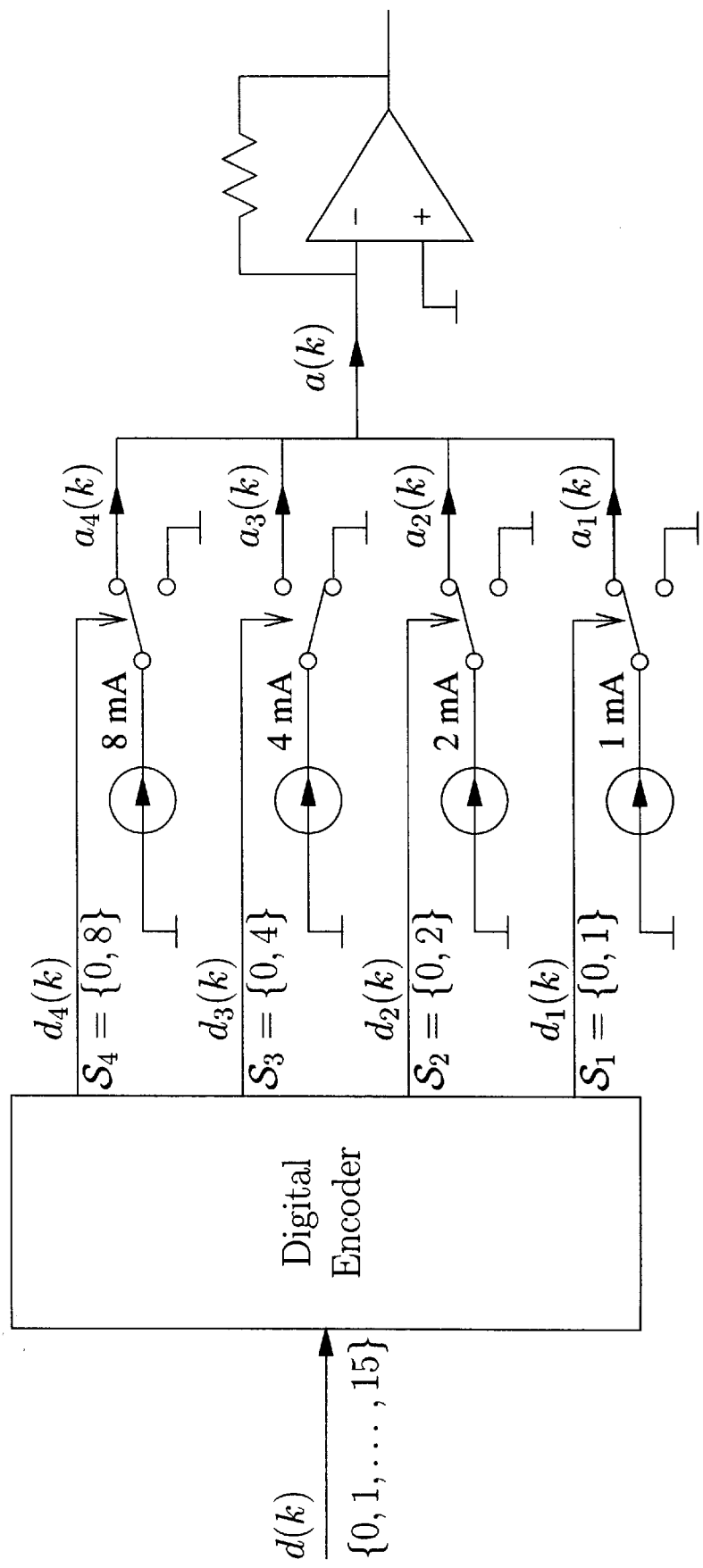
FIG. 1 shows a typical 4-bit binary-weighted current-steering D/A converter (PRIOR ART).
Figure 2:
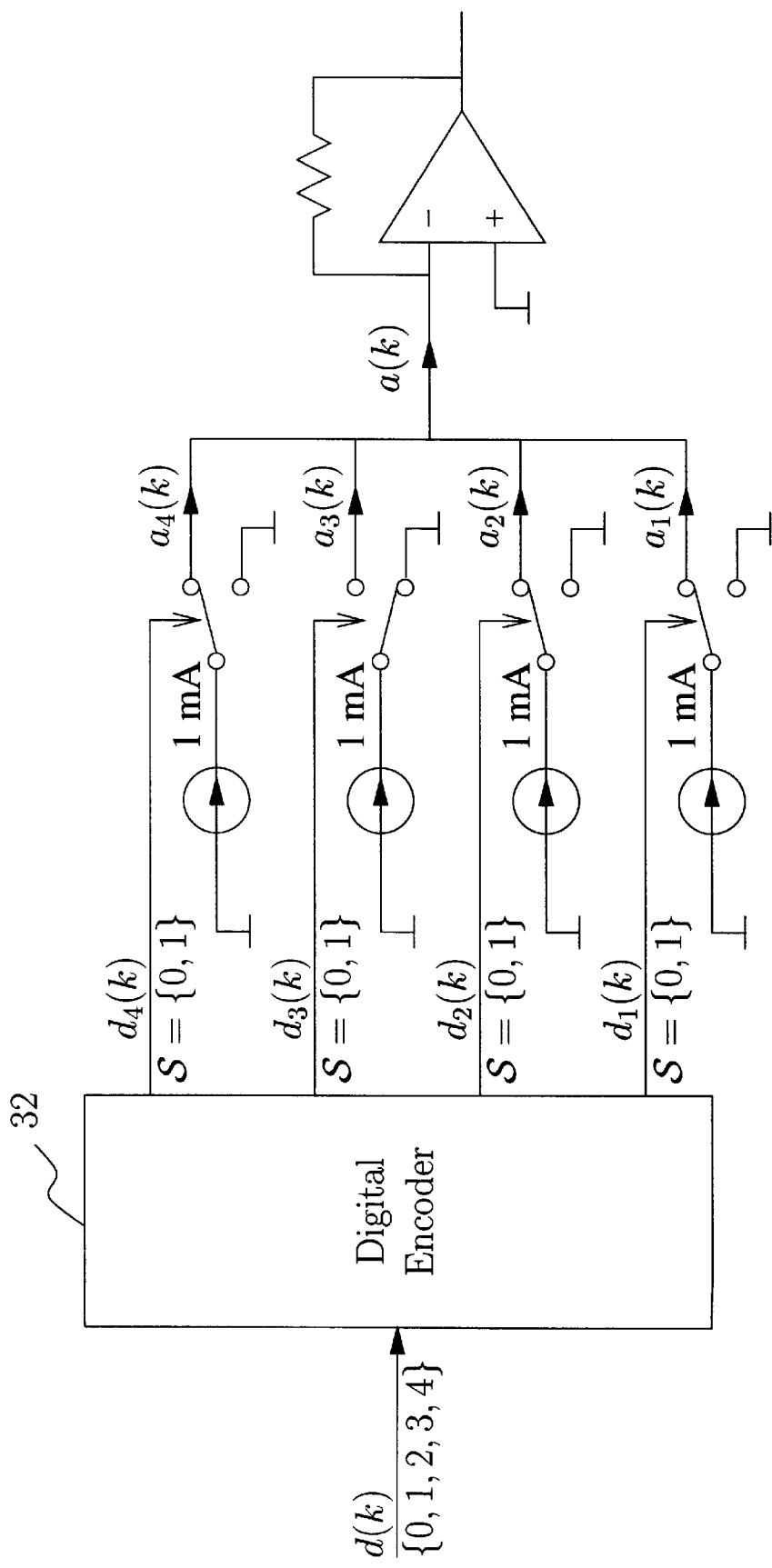
FIG. 2 shows a typical 5-level unit-element current-steering D/A converter (PRIOR ART).
Figure 3:
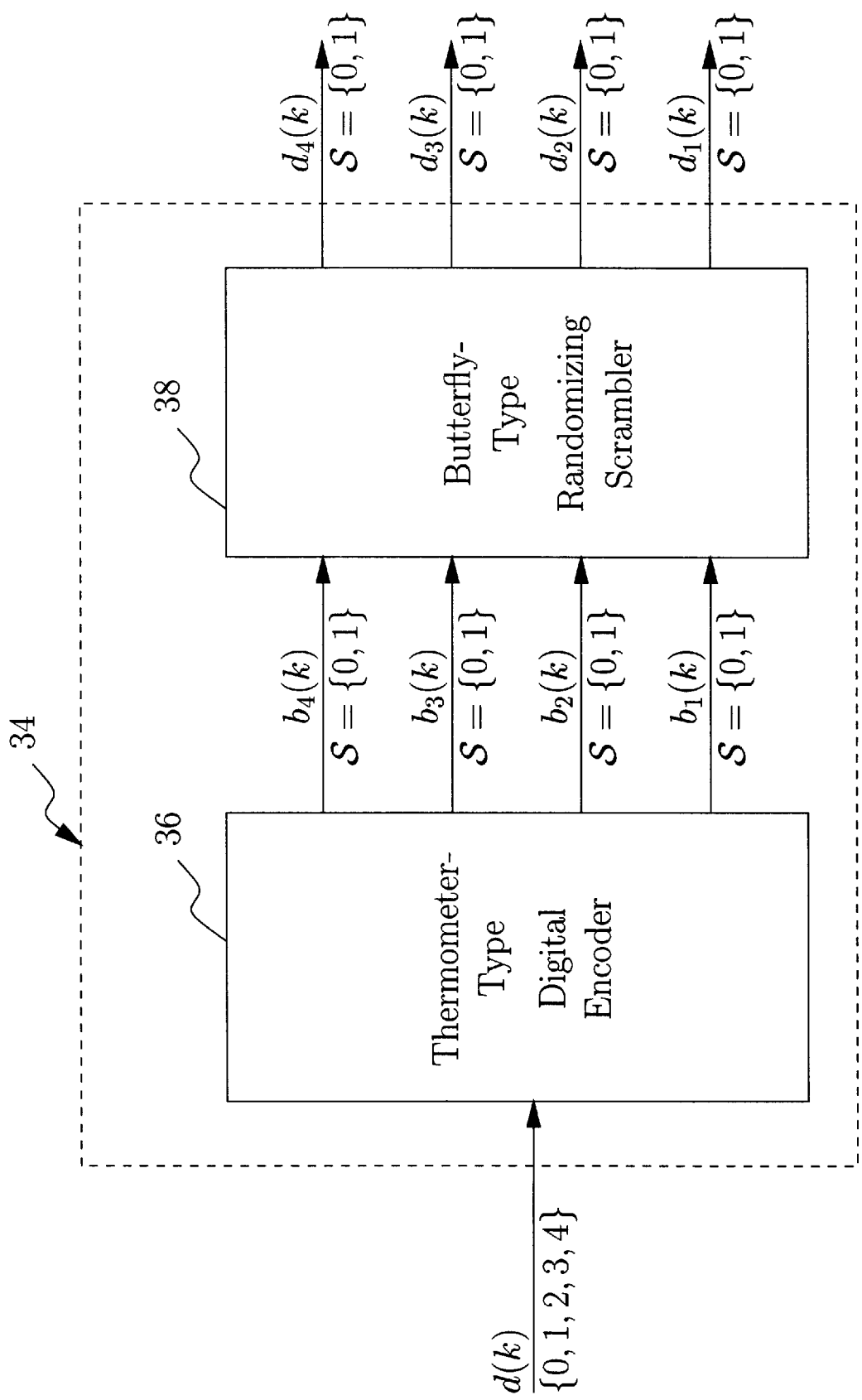
FIG. 3 shows the conceptual implementation of the randomized-scrambling encoder proposed by Carley (PRIOR ART).
Figures 4, 5:
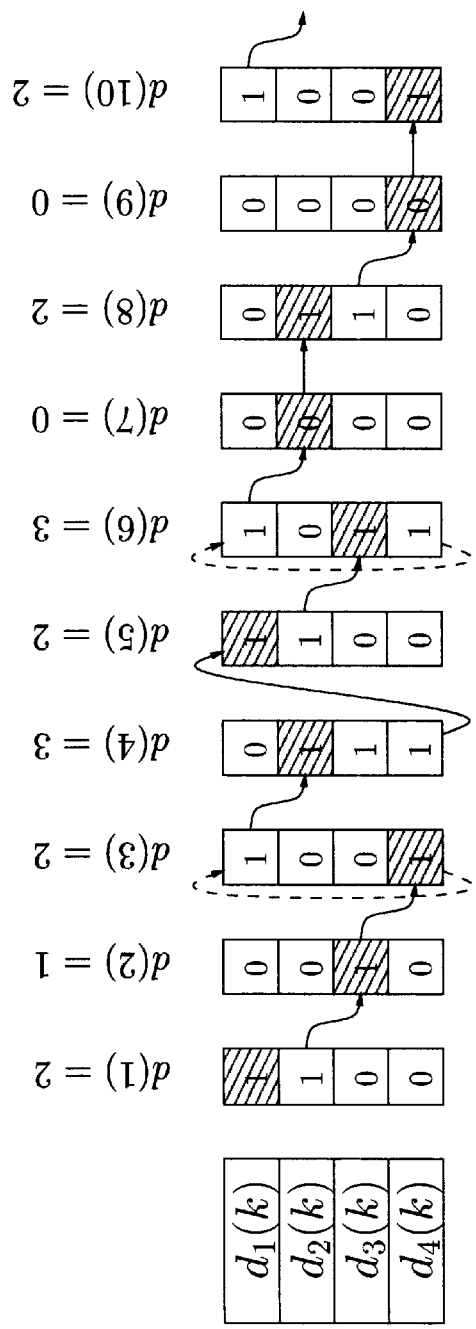
FIG. 4 shows the truth table for a 5-level thermometer-type encoder (PRIOR ART).
FIG. 5 shows an example of the operation of an element-rotation-scheme (ERS) mismatch-shaping encoder (PRIOR ART).
Figure 7:
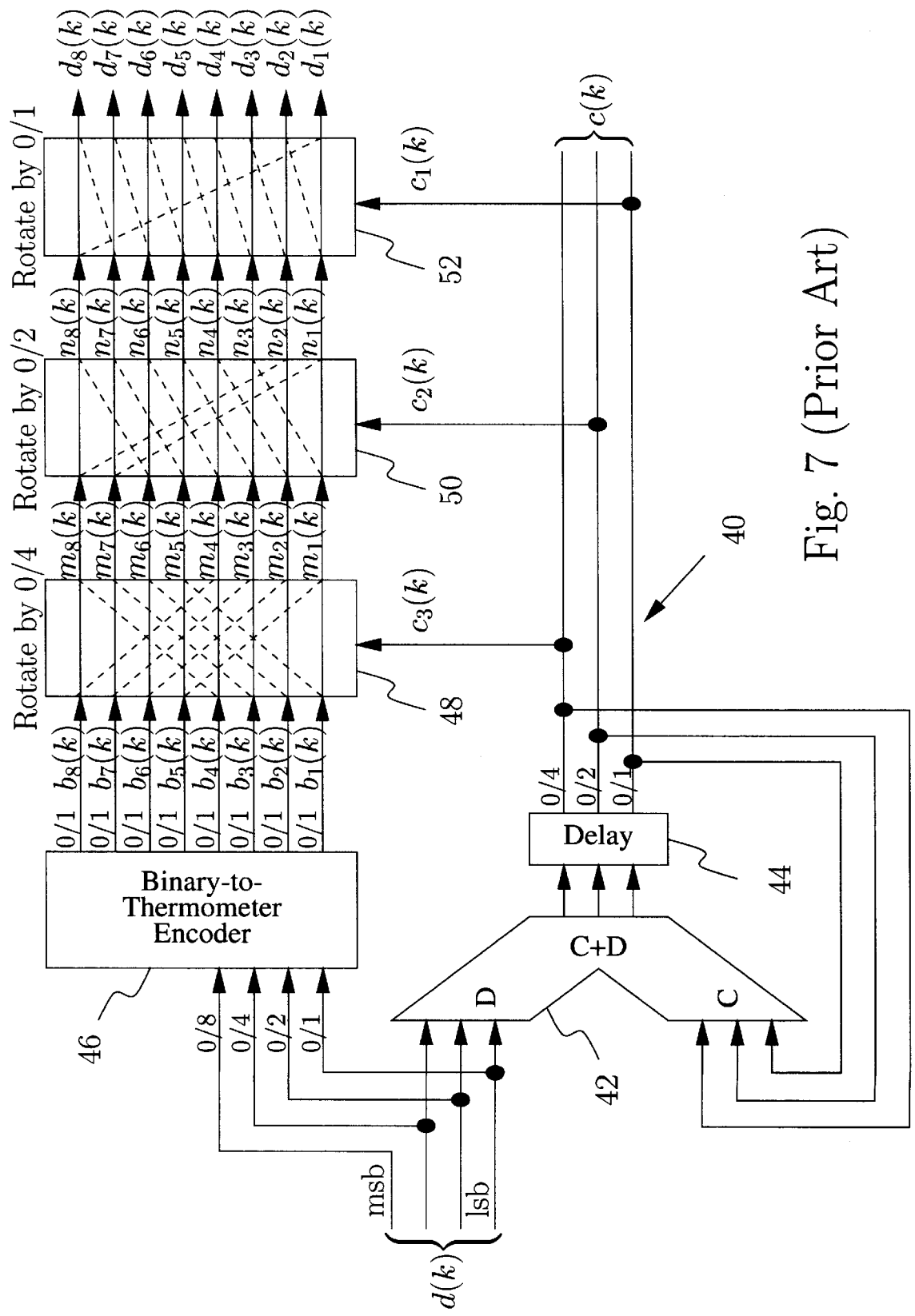
FIG. 7 shows a low-complexity 9-level ERS mismatch-shaping encoder (PRIOR ART).
Figure 11:
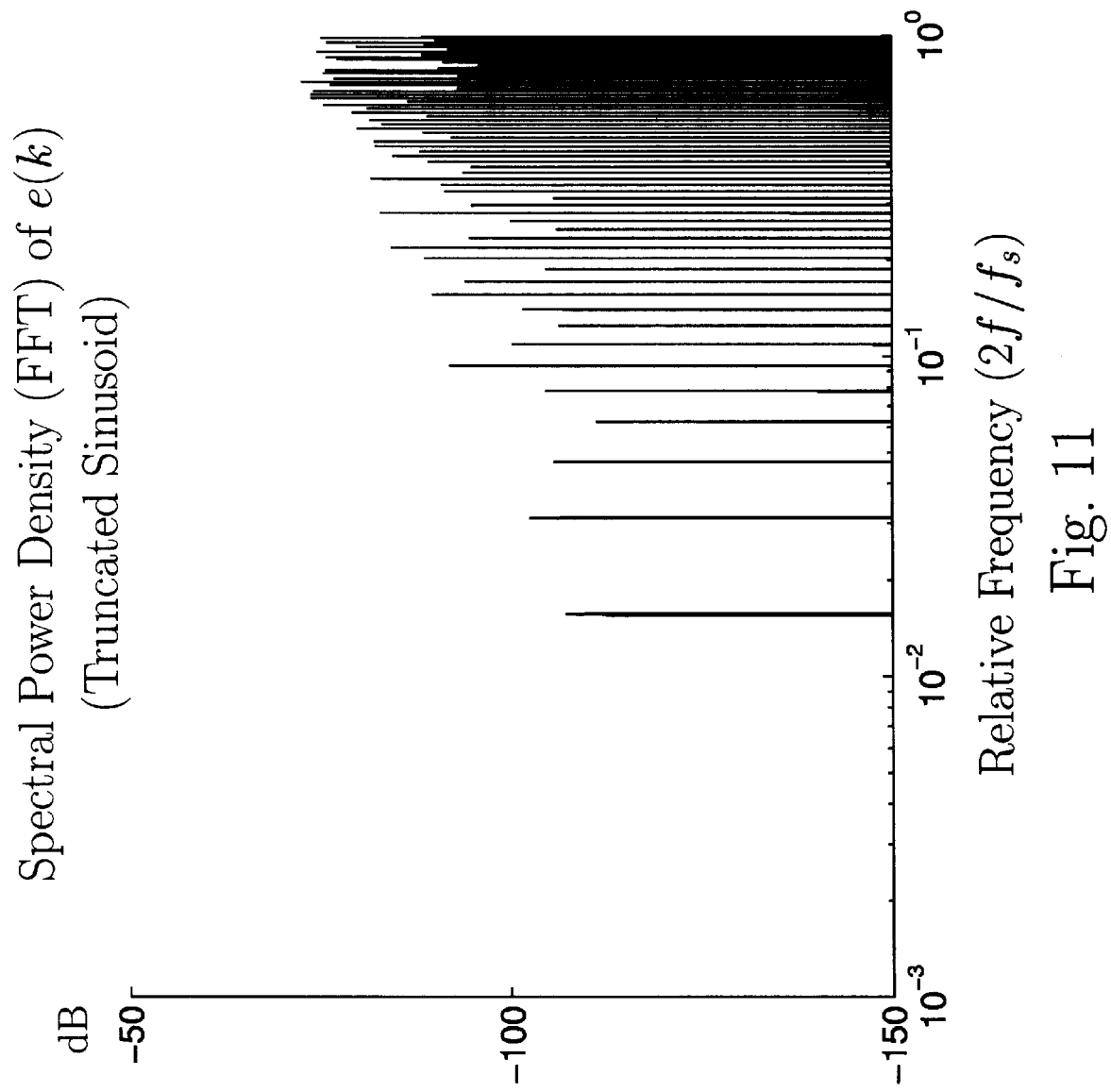
FIG. 11 shows a simulation result of the spectral power density of the error signal from a ERS D/A converter applied a periodic input signal.
Figure 12:
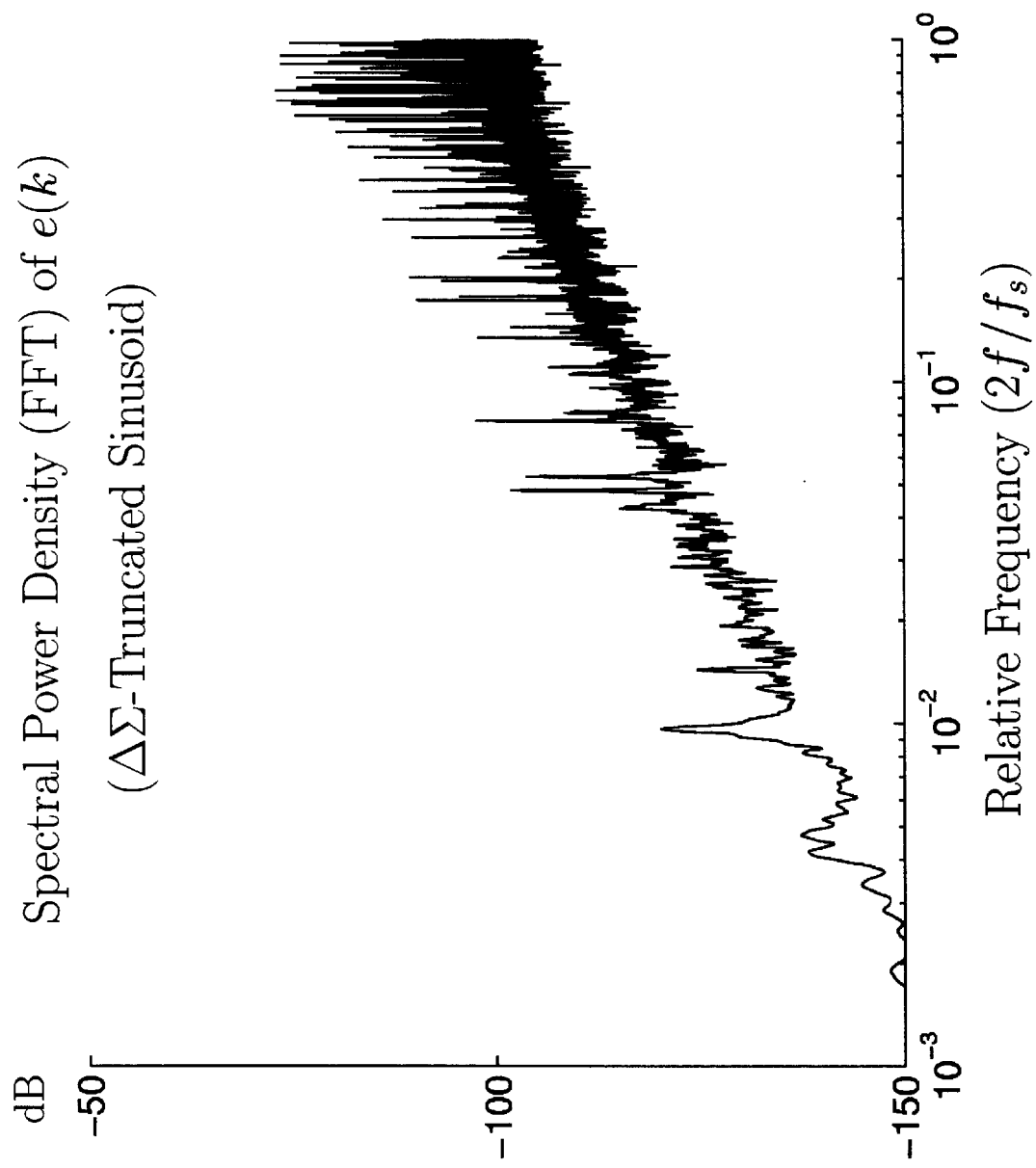
FIG. 12 shows a simulation result of the spectral power density of the error signal from a ERS D/A converter applied an aperiodic AE-modulated representation of a periodic input signal.
Figure 13:
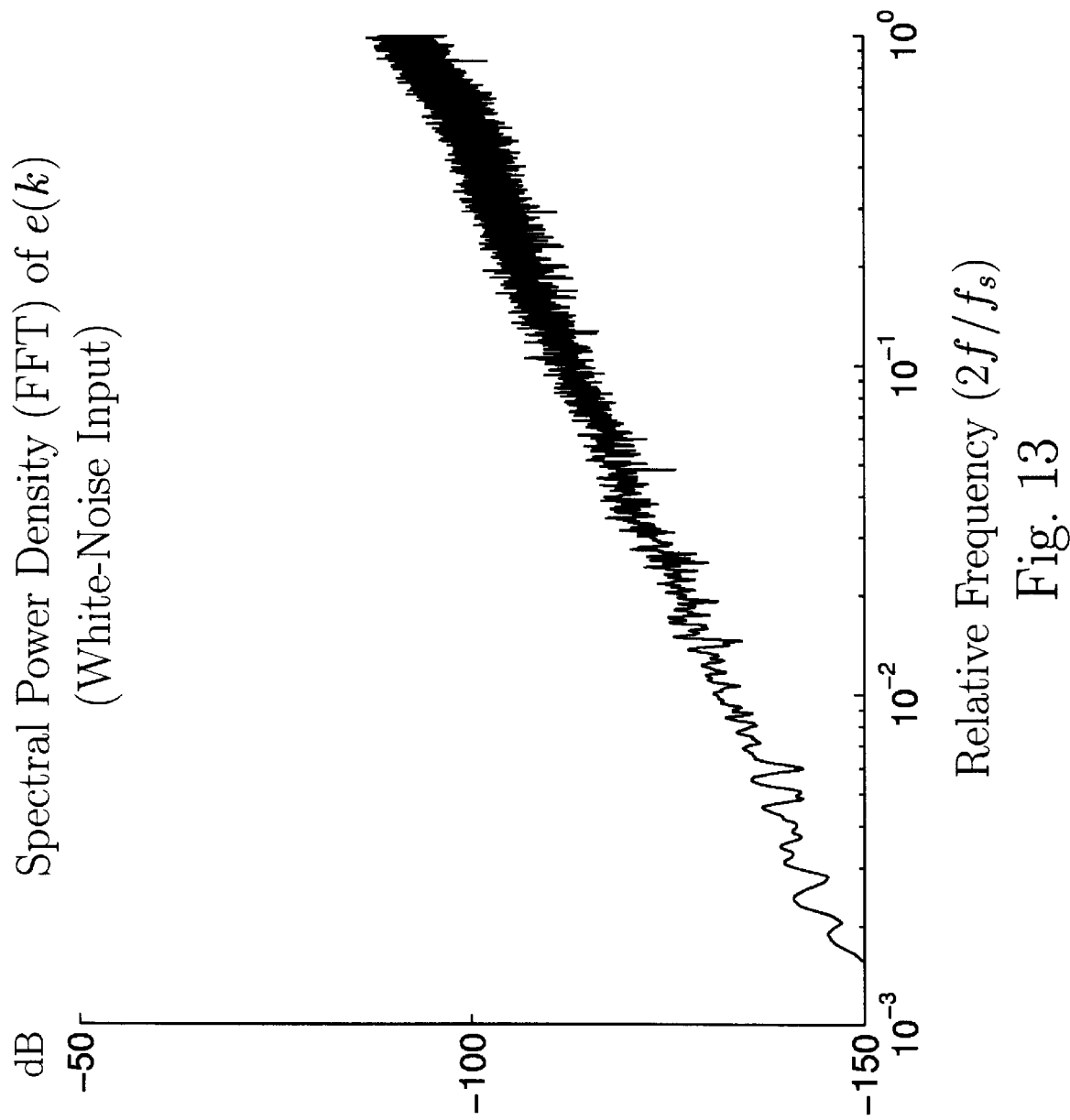
FIG. 13 shows a simulation result of the spectral power density of the error signal from a ERS D/A converter applied a random (white noise) input signal.
Figure 23:
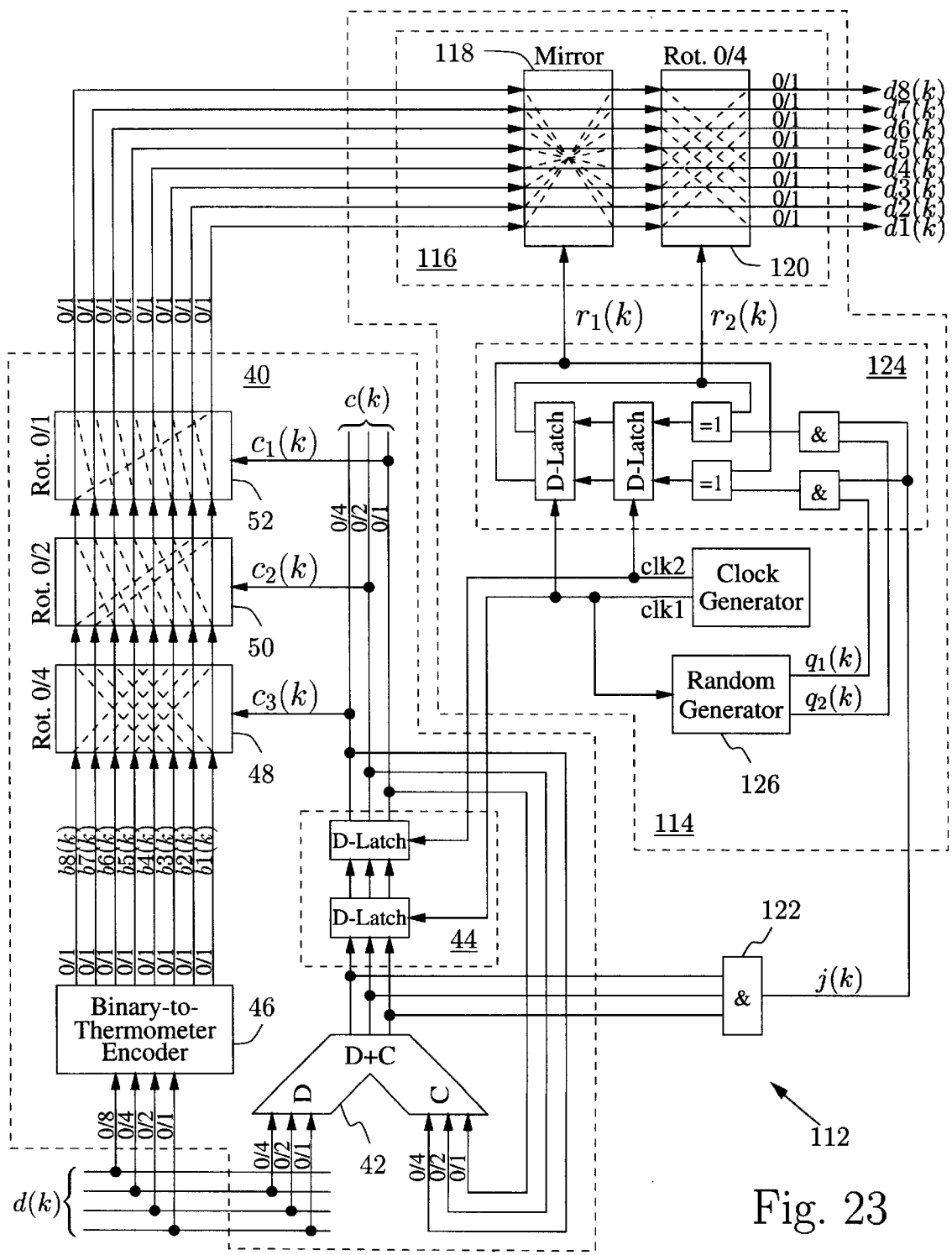
FIG. 23 shows a fourth, and overall most preferred, embodiment of this invention.

FIG. 23 shows the preferred implementation of the mismatch-shaping encoder [112] discussed above. It is based on an element-rotation-scheme (ERS) encoder [40] implemented as shown in FIG. 7 and discussed above. The reference numerals [42], [44], [46], [48], [50], and [52] are the same as those used in FIG. 7.

The eight signals generated by the ERS encoder [40] are interchanged by a permutation circuit [114], thereby generating the digital subsignals $d_i(k)$. The permutation is performed by a scrambler [116], which interchanges the signals as a function of two selector signals, $r_1(k)$ and $r_2(k)$. The scrambler [116] consists of a mirroring demultiplexer [118] and a rotate-by-0/4 demultiplexer [120], which are equivalent to the elements [104] and [58] in FIG. 19. Hence, the scrambler [116] will, as a function of the selector signals, provide one of four permutations. In general, it is preferable that the permutations are as different as possible, i.e., mirroring and rotate-by-0/4 permutations are generally preferable in comparison to, for example, a rotate-by-0/1 permutation or a permutation obtained by interchanging neighboring elements (used in butterfly scramblers).

The selector signals may change only when the measure which the mismatch-shaping encoder [40] attempts to minimize is zero. All base band first-order mismatch-shaping encoders attempt to use the unit elements equally often, and thus, the selector signals are allowed to change only when the unit elements have been used the same number of times (with respect to an arbitrary chosen, but constant, origin in time). This condition is particularly simple to detect for ERS encoders [40]; it occurs when the adder [42] provides a predefined output code. In this embodiment the code '111' has been selected arbitrarily. The detection is performed by the AND gate [122], which generates the control signal j(k). Thus, the selector signals are allowed to change only when j(k)=1.

The selector signals, $r_1(k)$ and $r_2(k)$, are provided by a small digital state machine [124]. When j(k)=0, the state machine [124] operates as a 2-bit memory cell storing the selector signals. When j(k)=1, the selector signals are altered randomly. A random generator [126] provides two flip-coin random signals, $q_1(k)$ and $q_2(k)$, which are used to alter the selector signals randomly. More precisely, $r_1(k)$ is altered only when j(k) and $q_1(k)$ both are logic-high. Similarly, $r_2(k)$ is altered only when j(k) and $q_2(k)$ both are logic-high.

9.2 Theory of Operation

In the section discussing prior art, it was argued that (for ERS encoders) the error signal e(k) is the first-order difference of a signal s(k), where s(k) is a static nonlinear function of the rotation pointer c(k). The objective of the permutation circuit [114] is to switch among several such static nonlinear functions. The signal s(k) thereby becomes a static nonlinear function of both c(k) and the selector signal r(k) (i.e., the pair of $r_1(k)$ and $r_2(k)$). If r(k) is a sufficiently busy random signal, s(k) and thus e(k) will not be pseudo-periodic/tonal, i.e., idle tones are effectively suppressed.

9.2.1 Performance Evaluation

Each permutation provided by the scrambler [116] can be construed as to be associated with a separate ERS encoder [40] to which the input signal d(k) is multiplexed in a way similar to that as for GLA encoders. Not only ERS encoders [40], but all mismatch-shaping encoders attempt to minimize some measure M of the error signal e(k). For base band first-order mismatch-shaping encoders, such as ERS encoders, M can be defined as the integral/summation of e(k), which above was represented by s(k). For the considered encoder [112], the four ERS encoders [40] can be described by each their measure, $M_1$, $M_2$, $M_3$, and $M_4$, and the overall encoder [112] be described by the sum of them, i.e., $M=M_1+M_2+M_3+M_4$. By switching among the four ERS encoders [40] only when c(k+1) (the value provided by the adder [42]) has a predefined value (here '111'), it is assured that all but the active ERS encoder's [40] measure, $M_i$, is zero. Thus, the overall performance will be as good as that of the internal encoder, i.e., the ERS encoder [40], except for the important difference that idle tones are efficiently suppressed.

The ERS encoder [40] may be replaced by any type of mismatch-shaping encoder, say a bandpass mismatch-shaping encoder, whereby the overall encoder [112] will attain the internal encoder's characteristic (i.e., the bandpass characteristic) and be less tonal than the internal encoder alone. It must, however, be assured that the selector signal is changed only when the measure M used to evaluate the error signal e(k) is 0. M is not the same for all types of mismatch-shaping encoders, but it is a characteristic that it is uniquely described by the internal encoder's state variable (s). Hence, in the general case, the AND gate [122] must be replaced by a circuit that detects when the internal encoder's state variable(s) each attain a predefined value.

The proposed technique to suppress idle tones is most efficient when used in combination with an internal mismatch-shaping encoder for which it frequently occurs that M=0, i.e., j(k)=1. Hence, the technique is particularly efficient for low-resolution first-order encoders, including simple bandpass mismatch-shaping encoders (although they, in principle, are of second order). The efficient implementation of good low-resolution mismatch-shaping encoders is particularly important because such encoders are used widely for the implementation of scaled-element mismatch-shaping encoders (described in U.S. patent application Ser. No. 60/044,665). Furthermore, in the above-mentioned Ph.D. thesis by Jesper Steensgaard, it was argued that first-order mismatch-shaping encoders generally are preferable to second-order mismatch-shaping encoders, even when circuit complexity is not taken into consideration. Hence, the proposed technique to suppress idle tones is most efficient for the implementation of the commercially most important encoders.

Although they are second-order encoders, it should be understood that the technique is equally useful and efficient for the implementation of simple bandpass mismatch-shaping encoders. Such encoders can be implemented on the basis of two encoders that are multiplexed every other sample; each encoder being an ERS encoder for which the direction of rotation is alternated every fourth sample (prior art). For such encoders it will frequently occur that j(k)=1, and thus, the technique is an efficient remedy to suppress idle tones.

10 CONCLUSION, RAMIFICATION, AND SCOPE OF INVENTION

The reader will see that idle tones can be suppressed in mismatch-shaping encoders using very simple means. The general element is that a stochastic process is used break any patterns in the digital subsignals that control the D/A converter's unit elements. A very simple technique is to alternate randomly between two seperate unit-element encoders, thereby assuring that each encoder's input signal, and thus the error signal, is aperiodic. This technique is so efficient that even the simplest (and poorest in terms of idle tones) encoders can be used without encountering idle-tone problems. In comparison with the so-called grouped-level-averaging (GLA) encoders, the use of only two encoders yields a superior performance. An aspect of this invention is that the encoder can be implemented using only very little hardware, the majority of which is shared by the two encoders. Thus, the overall complexity is comparable to that of the simplest known mismatch-shaping encoders, but the idle-tone performance is considerably better.

It was particularly pointed out that the two encoders need not be based on the same algorithm; two ERS encoders can, for example, be based on rotation in opposite directions. It was argued that the performance can be improved by switching (randomly) between two (or preferably more) encoders only when the unit elements have been used equally often (for first-order baseband encoders). This concept was generalized to a system comprising an arbitrary mismatch-shaping encoder, a scrambler which permutes the digital subsignals as a function of a random selector signal, and a detection circuit that detects when the selector signal is allowed to change. It was demonstrated that this technique can be used to implement very simple, yet highly efficient, mismatch-shaping encoders. The technique is equally efficient for baseband and bandpass encoders, and it is particularly useful for the implementation of scaled-element mismatch-shaping encoders.

While the above description contains many specificities, these should not be construed as limitations of the scope of the invention, but rather as an exemplification of several preferred embodiments thereof. Many other variations are possible. For example, the technique can easily be used for bandpass applications, for encoders of arbitrary resolution, and for encoders based on non-ERS and higher-order mismatch-shaping encoders. Clearly, the scrambler [114] can be designed to switch among more or less than the 4 permutations used in the given example, and the encoders can be used to drive unit-element D/A converters of arbitrary type, particularly including filtering D/A converters. Furthermore, since mismatch-shaping encoders are typically entirely digital systems, possibly excluding any random generators, they can be implemented in multiple ways achieving the same relationship between the input and output signals. The technique can also be used to suppress idle tones in $\Delta\Sigma$ modulators, which can be implemented with multiple loop filters among which the error signal can be multiplexed randomly. Also, it can be used to suppress idle tones in mismatch-shaping two-capacitor serial DACs.

Accordingly, the scope of the invention should be determined not by the embodiments, but by the appended claims and their legal equivalents.

I claim:

1. An improved mismatch-shaping encoder receiving a multi-level digital input signal and providing an ordered set of N two-level digital subsignals, comprising:
    a) an internal mismatch-shaping encoder receiving said multi-level digital input signal and providing an ordered set of N-two level digital intermediate signals; said internal mismatch-shaping encoder comprising a digital state machine having at least two distinct states;
    b) a scrambler receiving said ordered set of N two-level digital intermediate signals and providing said ordered set of N two-level digital subsignals; said ordered set of N two-level digital subsignals being a permutation of said ordered set of N two-level digital intermediate signals; said permutation being a function of a selector signal;
    c) a permutation controller generating said selector signal;
    d) said selector signal can transition from a first value to another value only when said digital state machine transitions to a state which is equivalent to the state it transitioned to when said selector signal made its most recent transition to said first value from a value different from said value.

2. The improved mismatch-matching encoder of claim 1, wherein said selector signal is partly a function of a signal which does not comprise periods of duration less than 256.

3. An improved mismatch-shaping encoder receiving a multi-level digital input signal and providing an ordered set of N two-level digital subsignals, comprising:
  a) an internal mismatch-shaping encoder receiving said multi-level digital input signal and providing an ordered set of N-two level digital intermediate signals; said internal mismatch-shaping encoder comprising a digital state machine having at least two distinct states;
  b) a scrambler receiving said ordered set of N two-level digital intermediate signals and providing said ordered set off N two level digital subsignals; said ordered set of N two-level digital subsignals being a permutation of said ordered set of N two-level digital intermediate signals; said permutation being a function of a selector signal;
  c) a permutation controller generating said selector signal;
  d) said selector signal can make a transition from a first value to second value only when said digital state machine transitions to a state predefined for said second value;
  e) said selector signal is generated partly on the basis of a signal which approximates a random sequence.

4. An improved mismatch-shaping encoder receiving a multi-level digital input signal and providing an ordered set of N two-level digital subsignals, comprising:
  a) an internal mismatch-shaping encoder receiving said multi-level digital input signal and providing an ordered set of N-two level digital intermediate signals; said internal mismatch-shaping encoder comprising the following five elements:
    (i) a digital state machine having at least two distinct states;
    (ii) an adder generating a sum signal; said sum signal being equal to the sum, using modulo-N arithmetic, of said multi-level digital input signal and a rotation-pointer signal;
    (iii) a delay element generating said rotation-pointer signal by delaying said sum signal;
    (iv) an encoder generating a second ordered set of N two level digital intermediate signals, the sum of which equals said multi-level digital input signal;
    (v) an N-by-M multiplexer generating rotated permutations of said second set of N two-level digital intermediate signals;
  b) a scrambler receiving said ordered set of N two-level digital intermediate signals and providing said ordered set off N two level digital subsignals; said ordered set of N two-level digital subsignals being a permutation of said ordered set of N two-level digital intermediate signals; said permutation being a function of a selector signal;
  c) a permutation controller generating said selector signal.

5. The improved mismatch-shaping encoder of claim 4 further comprising: a) a detector circuit that detects when said sum signal has a predefined value;
  (b) a signal generator providing a random-like signal approximating a random sequence; said selector signal being assigned a new value as a function of said random-like signal only when said sum signal has said predefined value.

6. A method for converting a multi-level digital input signal into an analog output signal, comprising the steps of:
  (a) converting said multi-level digital input signal into an ordered set of N two-level digital subsignals using a mismatch-shaping encoder;
  (b) providing an ordered set of N digital-to-analog converters generating N analog subsignals;
  (c) defining a multiplexing relationship between said ordered set of N two-level digital subsignals and said ordered set of N digital-to-analog converters, such that each of said N digital-to-analog converters is used for the digital-to-analog conversion of exactly one digital subsignal in said ordered set of N two-level digital subsignals;
  (d) detecting when a predefined measure of said ordered set of N two-level digital subsignals has a predefined value;
  (e) redefining said multiplexing relationship only when said predefined measure has said predefined value; said multiplexing relationship can attain at least two different definitions;
  (f) generating said analog output signal by adding said N analog subsignals.

7. The method of claim 6, wherein the step of redefining said multiplexing relationship comprises the step of
  (a) generating a signal which approximates a random sequence.

8. The method of claim 6, wherein the step of detecting when said predefined measure of said ordered set of N two-level digital subsignals has said predefined value comprises the steps of:
  (a) choosing an origin in time with respect to which the signals in said ordered set of N two-level digital subsignals are defined;
  (b) identifying when all signals in said ordered set of N two-level digital subsignals have attained a second predefined value equally many times since said origin in time.

9. The method of claim 6, wherein the step of detecting when said predefined measure of said ordered set of N two-level digital subsignals has said predefined value comprises the step of
  (a) generating an ordered set of N two-level digital filtered signals by filtering each signal in said ordered set of N two-level digital subsignals using filters with predefined characteristics.

10. The method of claim 6, wherein the step of converting said multi-level digital input signal into an ordered set of N two-level digital subsignals using a mismatch-shaping encoder comprises the step of
  (a) calculating a running sum, using modulo-N arithmetic, of said multi-level digital input signal.

11. A method for converting a multi-level digital input signal into an analog output signal, comprising the steps of:
  (a) generating a set of P selector signals on the basis of a signal which approximates a random sequence; each selector signal attaining only the values 0 and 1; the sum of said P selector signals being constant 1;
  (b) generating an ordered set of N two-level digital subsignals which, for any one considered selector signal of said P selector signals, has the following property:
    (i) the set of signals that would result by multiplying said considered selector signal with each signal in said ordered set of N two-level digital subsignals is equivalent to the set of signals that would result from encoding with a predefined mismatch-shaping encoder a signal generated by multiplying said considered selector signal with said multi-level digital input signal;

(c) generating N analog subsignals by digital-to-analog converting the N digital subsignals using an array of digital-to-analog converters;

(d) generating said analog output signal by adding said N analog subsignals.

12. The method of claim 11, wherein
(a) said set of P selector signals consists of exactly two selector signals.

13. The method of claim 11, wherein the step of generating said set of P selector signals comprises the step of
(a) generating a signal which approximates a random sequence.

14. The method of claim 11, wherein
(a) said predefined mismatch-shaping encoder is an element-rotation-scheme encoder.

15. The method of claim 11, wherein the step of generating said set of P selector signals comprises the step of
(a) detecting when a predefined measure of said ordered set of N two-level digital subsignals attains a predefined value.

* * * * *